(12) United States Patent
Horiguchi et al.

(10) Patent No.: US 6,891,225 B2
(45) Date of Patent: May 10, 2005

(54) DYNAMIC SEMICONDUCTOR MEMORY DEVICE

(75) Inventors: Fumio Horiguchi, Tokyo-To (JP); Takashi Ohsawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 09/947,908

(22) Filed: Sep. 7, 2001

(65) Prior Publication Data

US 2002/0034855 A1 Mar. 21, 2002

(30) Foreign Application Priority Data

Sep. 8, 2000 (JP) ........................................ 2000-274221

(51) Int. Cl.[7] ........................ H01L 29/76; H01L 29/94; H01L 31/062; H01L 31/113; H01L 31/119
(52) U.S. Cl. ........................ 257/331; 257/332; 257/333
(58) Field of Search ................................ 257/330, 331, 257/332, 333, 334

(56) References Cited

U.S. PATENT DOCUMENTS

| 5,258,635 | A | | 11/1993 | Nitayama et al. |
| 5,416,350 | A | * | 5/1995 | Watanabe ................. 257/330 |
| 6,124,611 | A | * | 9/2000 | Mori ........................ 257/330 |
| 6,188,105 | B1 | * | 2/2001 | Kocon et al. ............... 257/330 |
| 6,373,097 | B1 | * | 4/2002 | Werner ...................... 257/329 |
| 2002/0056871 | A1 | * | 5/2002 | Kocon et al. ............... 257/328 |

FOREIGN PATENT DOCUMENTS

| JP | 02-071556 | 3/1990 |
| JP | 02-188966 | 7/1990 |
| JP | 03-171768 | 7/1991 |
| JP | 05-036930 | 2/1993 |
| JP | 05-121693 | 5/1993 |

* cited by examiner

*Primary Examiner*—Ngân V. Ngô
(74) *Attorney, Agent, or Firm*—Banner & Witcoff, Ltd.

(57) ABSTRACT

A semiconductor memory device comprising: a source diffusion layer formed on a semiconductor substrate and connected to a fixed potential line; a plurality of columnar semiconductor layers arranged in a matrix form and formed on the source diffusion layer and each having one end connected to the source diffusion layer commonly, the columnar semiconductor layer taking a first data state with a first threshold voltage that excessive majority carriers are accumulated in the columnar semiconductor layer, and a second data state with a second threshold voltage that excessive majority carriers are discharged from the columnar semiconductor layer; a plurality of drain diffusion layers each formed at the other end of the columnar semiconductor layer; a plurality of gate electrodes each opposed to the columnar semiconductor layer via a gate insulating film, and connected to the word line; a plurality of word lines each connected to corresponding the gate electrodes; and a plurality of bit lines each connected to corresponding the drain diffusion layers, the bit lines being perpendicular to the word lines.

10 Claims, 24 Drawing Sheets

DYNAMIC SEMICONDUCTOR MEMORY DEVICE

CROSS-REFERENCE TO RELATED APPLICATIONS

This application is based upon and claims the benefit of priority from the prior Japanese Patent Application No. 2000-274221, filed on Sep. 8, 2000, the entire contents of which are incorporated herein by reference.

FIELD OF THE INVENTION

This invention relates to a dynamic semiconductor memory device (DRAM) and its manufacturing method.

BACKGROUND OF THE INVENTION

In conventional DRAM, each memory cell is up of a MOS transistor and a capacitor. Employment of trench capacitor structures and stacked capacitor structures has greatly progressed miniaturization of DRAM. Currently, size of each memory cell (cell size) has been reduced to the area of $2F \times 4F = 8F^2$ where F is the minimum processible size. That is, the minimum processible size F has been getting smaller and smaller through some periods of generation. If the cell size is generally expressed as $\alpha F^2$, the coefficient $\alpha$ has also decreased together, and today with $F=0.18 \mu m$, $\alpha=8$ has been realized.

To continue this trend regarding the cell size or chip size, it is requested to satisfy $\alpha<8$ for $F<18 \mu m$ and $\alpha<6$ for $F<13 \mu m$. Together with further progress of micro fabrication, it is an important issue how small area each cell can be formed in. In this connection, there are various proposals toward reducing the cell size of one-transistor/one capacitor memory cells to $6F^2$ or $4F^2$. However, practical application of these proposals is not easy because of the problems such as increase of electrical interference between adjacent memory cells and difficulties in the manufacturing techniques including processing and formation of films.

BRIEF SUMMARY OF THE INVENTION

According to an embodiment of the present invention, there is provided a semiconductor memory device comprising:

a source diffusion layer formed on a semiconductor substrate and connected to a fixed potential line;

a plurality of columnar semiconductor layers arranged in a matrix form and formed on the source diffusion layer and each having one end connected to the source diffusion layer commonly, the columnar semiconductor layer taking a first data state with a first threshold voltage that excessive majority carriers are accumulated in the columnar semiconductor layer, and a second data state with a second threshold voltage that excessive majority carriers are discharged from the columnar semiconductor layer;

a plurality of drain diffusion layers each formed at the other end of the columnar semiconductor layer;

a plurality of gate electrodes each opposed to the columnar semiconductor layer via a gate insulating film, and connected to the word line;

a plurality of word lines each connected to corresponding the gate electrodes; and a plurality of bit lines each connected to corresponding the drain diffusion layers, the bit lines being perpendicular to the word lines.

DETAILED DESCRIPTION OF THE INVENTION

Embodiments of the invention will now be explained below with reference to the drawings.

First Embodiment

Figure 1:
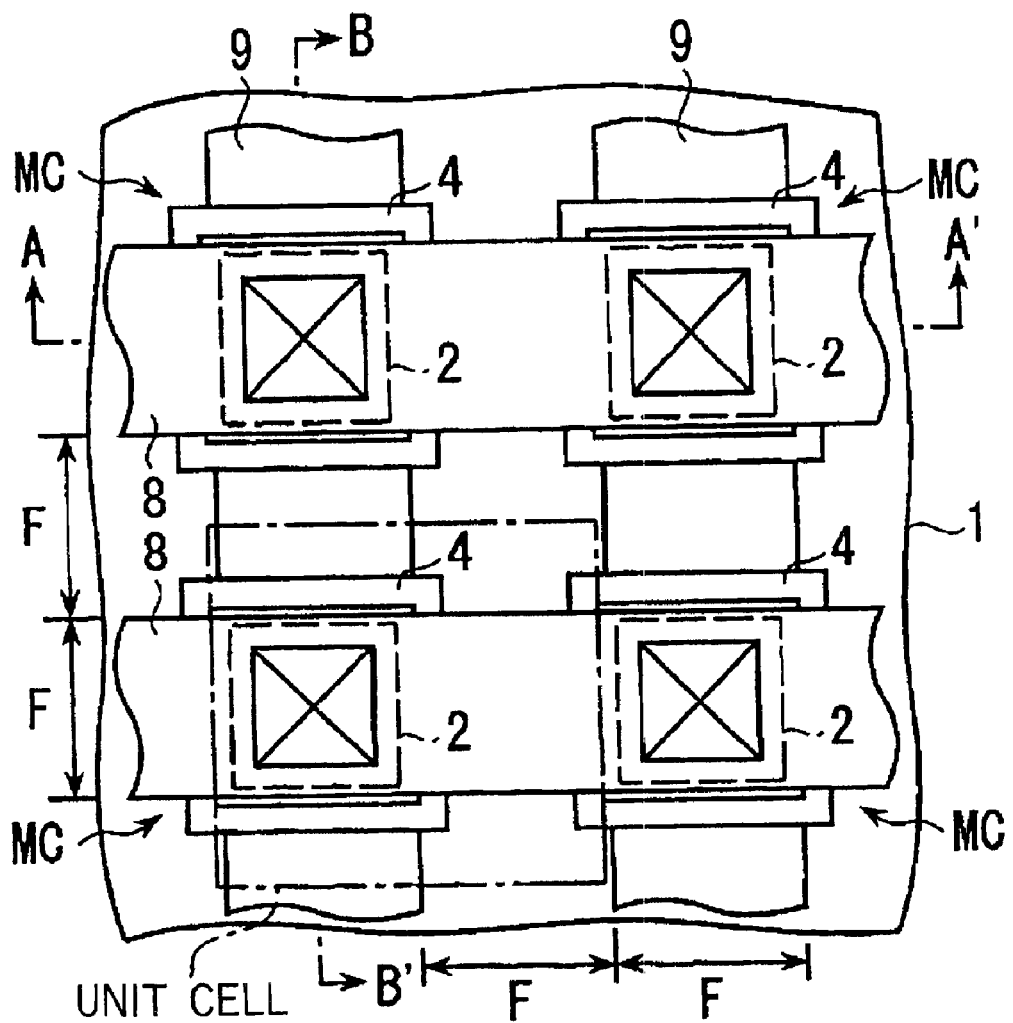
FIG. 1 is a diagram that shows a layout of a DRAM cell array according to an embodiment of the invention.
Figure 2:
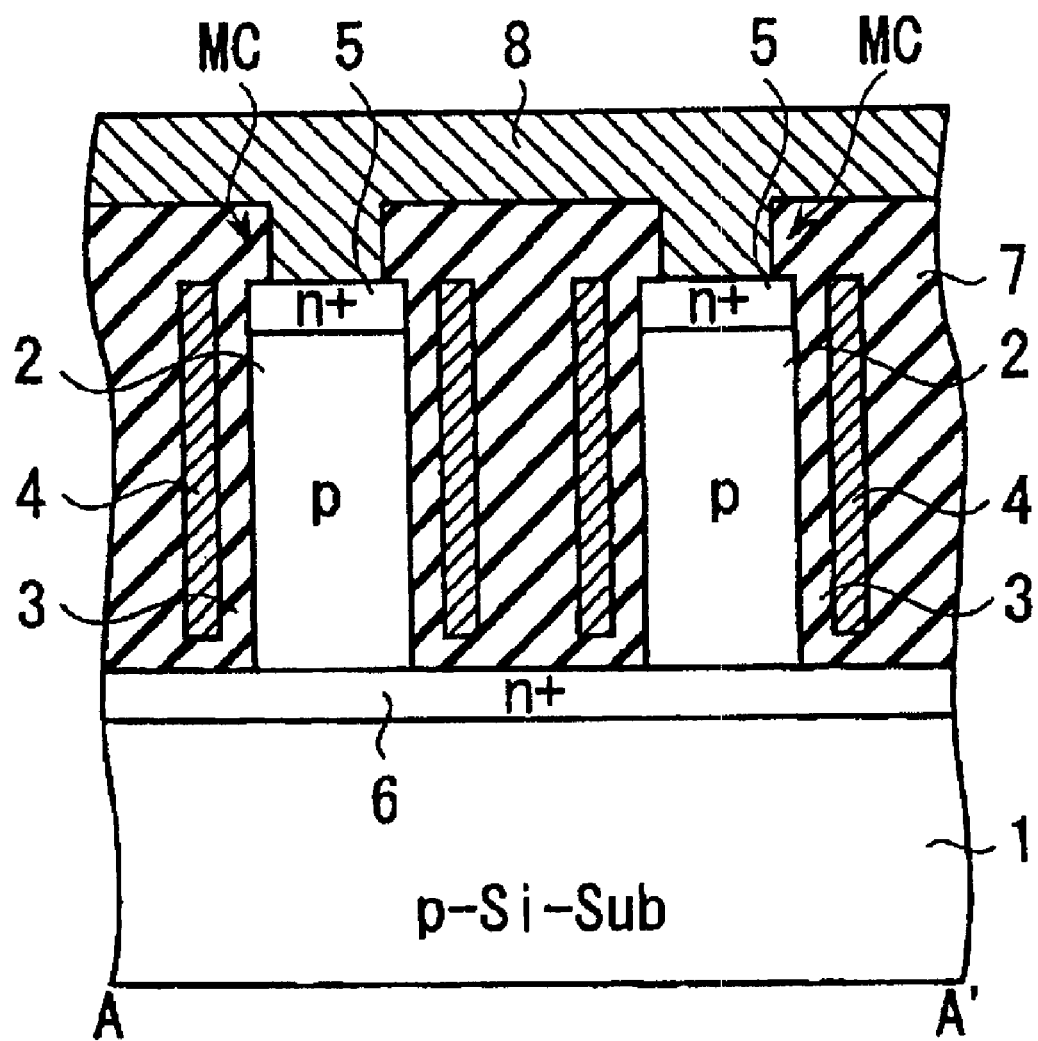
FIG. 2 is a cross-sectional view taken along the A–A' line of FIG. 1.
Figure 3:
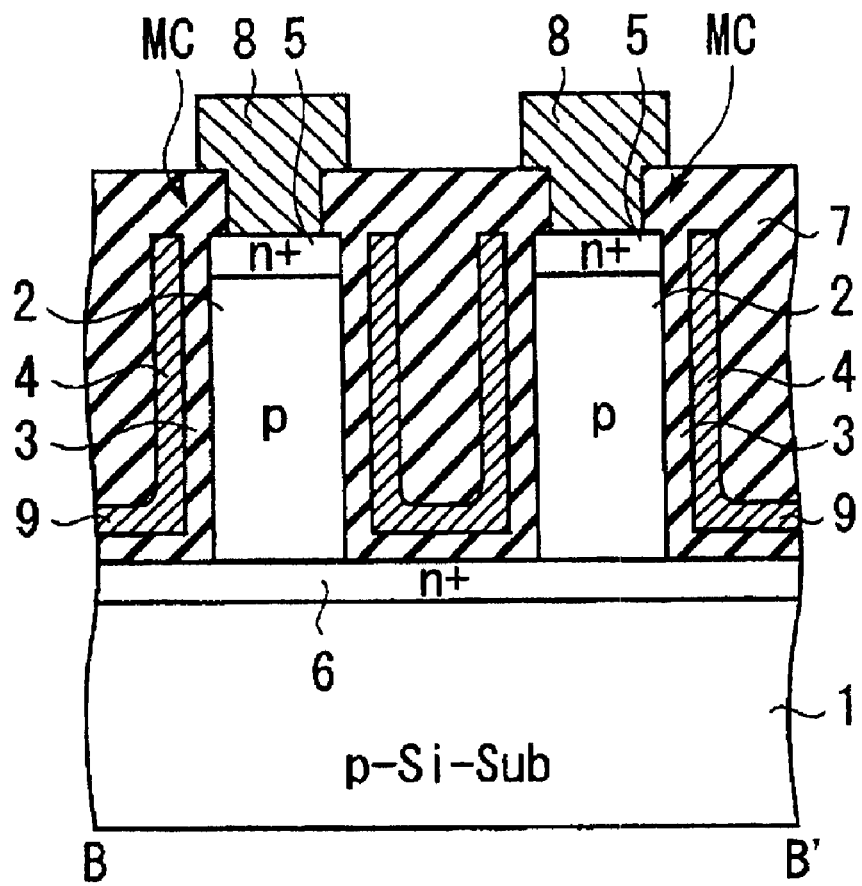
FIG. 3 is a cross-sectional view taken along the B–B' line of FIG. 1.

FIG. 1 is a diagram that shows a layout of a DRAM cell array according to an embodiment of the invention, and FIGS. 2 and 3 are cross-sectional views taken along the A–A' and B–B' lines of FIG. 1, respectively. Columnar silicon layers are formed in positions of respective memory cells MC by processing a p-type silicon substrate 1. Each memory cell MC is composed of a vertical MOS transistor formed by using the columnar silicon layer 2.

More specifically, the transistor of each memory cell MC is an NMOS transistor in which a gate electrode is formed to surround the columnar silicon layer 2 via a gate insulating film 3 and an $n^+$-type source diffusion layer 6 is formed at the bottom. This transistor structure is disclosed as so-called "SGT" in the paper "Impact of Surrounding Gate Transistor (SGT) for high density LSI's" by H. Takato et al. (IEEE Transactions on Electron Devices, vol. 38, No. 3, pp. 573–577, March 1991).

It is important for the source diffusion layer 6 formed at the bottom of the columnar silicon layer 2 to lie across the full extent of the bottom of the columnar silicon layer 2 to electrically insulate the p-type region of the columnar silicon layer 2 from the p-type region of the substrate 1. Thereby, in each memory cell MC, the columnar silicon layer 2 is held floating and can be controlled in bulk potential to enable dynamic recording operation by one transistor according to the invention, as explained later. In addition, the source diffusion layer 6 is formed to cover the entire surface of the substrate 1 to behave as a fixed potential line SS common to all memory cells MC.

The gate electrodes 4 surrounding the columnar silicon layer 2 are formed of a polycrystalline silicon film. By maintaining the same polycrystalline silicon film as the gate electrodes 4 continuously in one direction of the cell array, word lines (WL) 9 commonly connecting the gate electrodes 4 are formed. The surface having formed the transistors is covered by an inter-layer insulating film 7, and bit lines 8 are formed thereon. The bit lines 8 extend in the direction orthogonal to the word lines 9, and are connected to drain diffusion layers 5 of respective memory cells MC.

In this DRAM cell array, if the word lines 9 and the bit lines 8 are processed with lines and spaces of the minimum processible size F, as shown in FIG. 1, its unit cell area is $2F \times 2F = 4F^2$.

Figure 4:
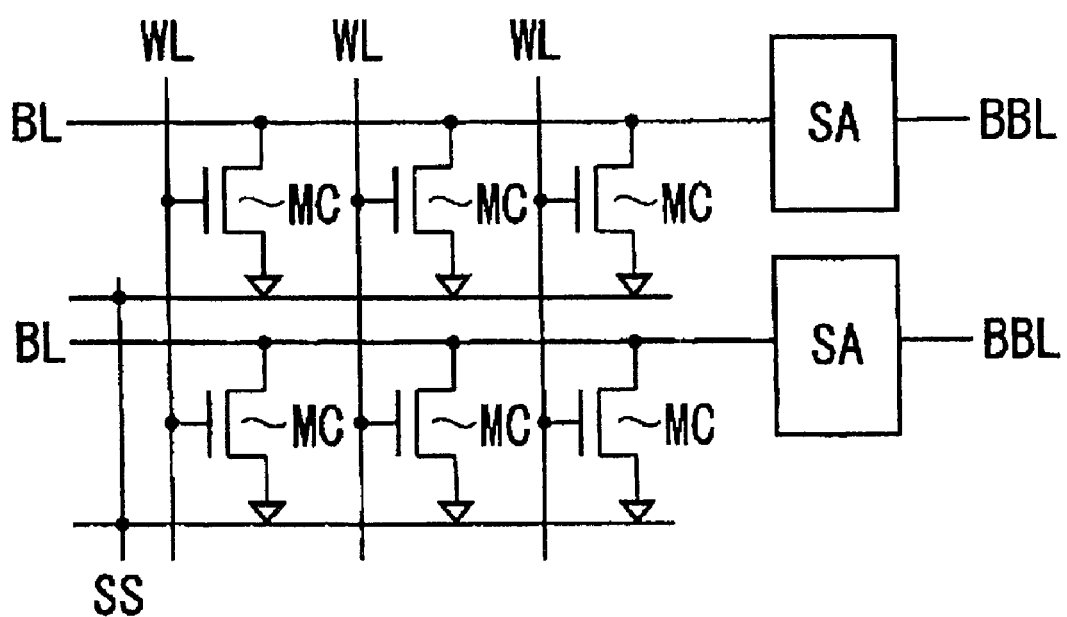
FIG. 4 is a equivalent circuit diagram of the same DRAM cell array.

FIG. 4 shows a equivalent circuit of this DRAM cell array. Each memory cell MC is composed only of a single NMOS transistor. Drains are connected to bit lines BL, gates are connected to word lines WL and sources are commonly connected to a fixed potential line SS. In this case, sense amplifiers SA are connected in an open bit line system, and a pair of bit lines BL, BBL of cell arrays disposed at opposite sides of each sense amplifier are connected to the sense amplifier SA. Therefore, although not shown, at least one dummy cell is disposed in each of the cell arrays associated with bit lines BL, BBL.

Operation principle of the DRAM cell made up of the NMOS transistor utilizes excessive accumulation of holes that are majority carriers in the bulk region (p-type columnar silicon layer 2 insulated and isolated from others) of the MOS transistor. More specifically, a predetermined positive potential is applied to the gate electrode while a large channel current is supplied from the drain diffusion layer 5, thereby to generate hot carriers by impact ionization and have the silicon layer 2 excessively hold holes that are majority carriers of the silicon layer 2. The excessive hold storage state (with a higher potential than in the thermal equilibrium state) is determined as data "1", for example. The state, in which the pn junction between the drain diffusion layer 5 and the silicon layer 2 is forwardly biased and excessive holes in the silicon layer 2 are released to the drain side, is determined as data "0".

Data "0" and "1" are different potentials of the bulk region, and they are stored as a difference of threshold voltages of the MOS transistor. That is, threshold voltage Vth1 in the sate of hi potential data "1" of the bulk region by storage of holes is lower than threshold voltage Vth0 in the state of data "0". In order to maintain the data "1" state accumulating majority carriers, holes, in the bulk region, it is necessary to apply a negative bias voltage to the word line WL. In this data holding state, read operation may be done as far as write operation of the opposite data (erase) is not effected. That is, unlike a one-transistor/one-capacitor DRAM relying charge storage of a capacitor, non-destructive read-out is possible.

Figure 5:
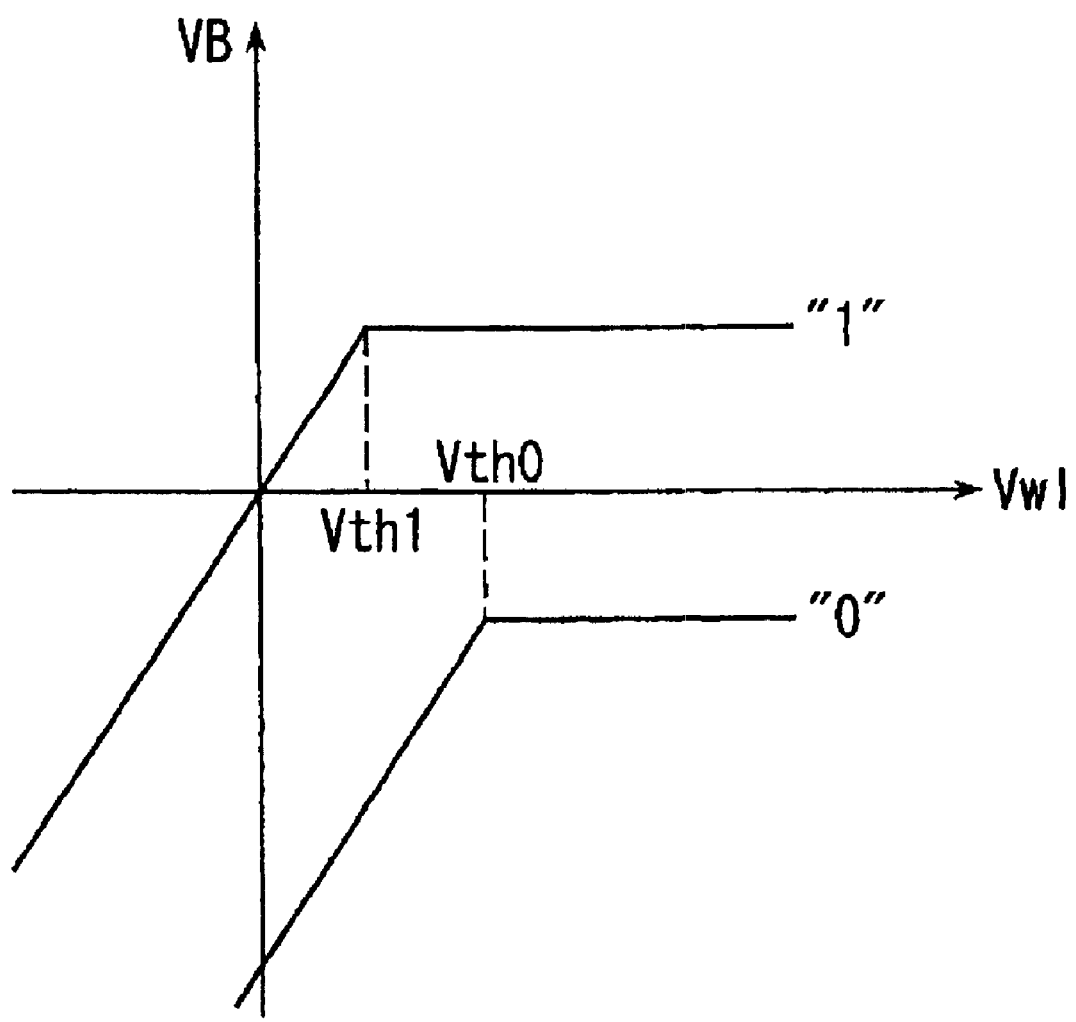
FIG. 5 is a diagram that shows a relation between a word line potential and a bulk potential in the same DRAM.
Figure 6:
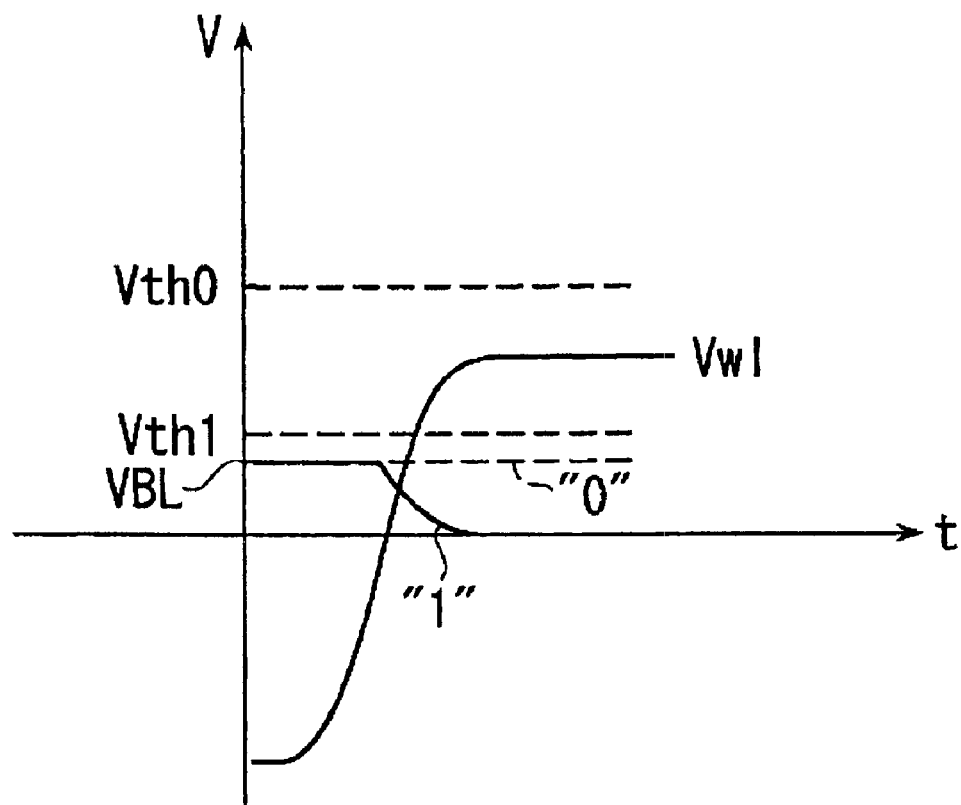
FIG. 6 is a diagram for explaining a data read system of the same DRAM cell.

There are some data read-out systems. Relation between a word line potential Vwl and a bulk potential VB is as shown in FIG. 5 in the relation between data "0" and "1". Therefore, a first data read-out method supplies the word line WL with a read-out potential that is an intermediate value between the threshold voltages Vth0 and vth1 of the data "0" and "1", and utilizes the phenomenon that no current flows in memory cells with data "0" but a current flows in memory cells with data "1". More specifically, for example, the bit line BL is precharged to a predetermined potential VBL, and the word line WL is driven later. As a result, as shown in FIG. 6, in case of data "0", no change occurs in the bit line precharge potential VBL, and in case of data "1", the precharge potential VBL decreases.

Figure 7:
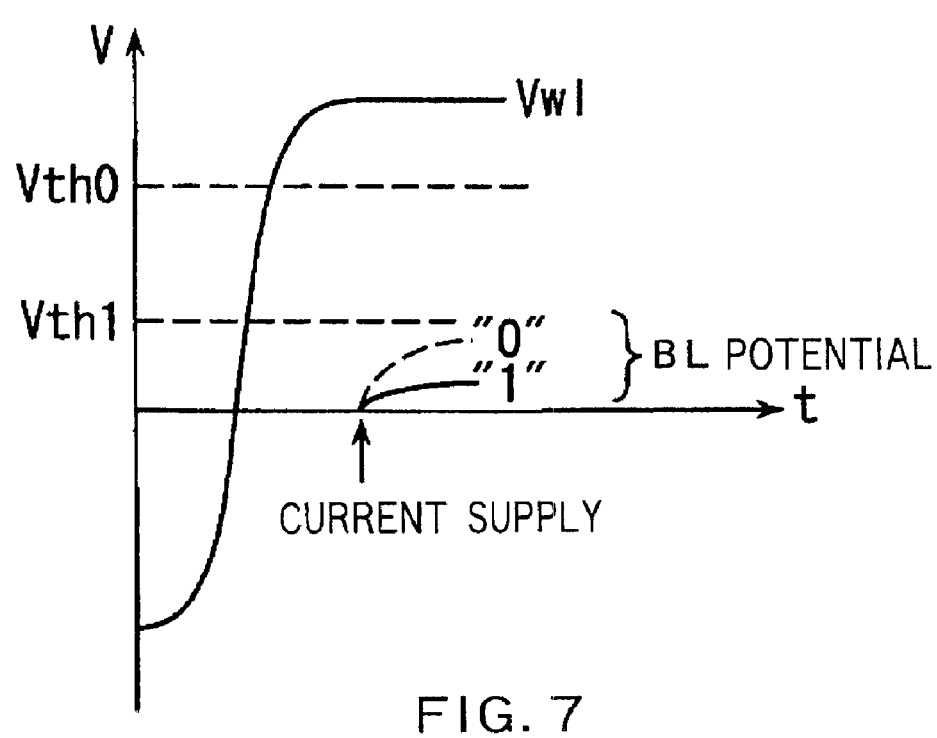
FIG. 7 is a diagram for explaining a data read system of the same DRAM cell.

A second read-out system supplies the bit line BL with a current after activating the word line WL, and utilizes a difference in rising speed of the bit line potential, depending upon conductivities of "0" and "1". Simply, the bit line BL is precharged to 0 V, and the word line WL is activated as shown in FIG. 7, thereby to supply the bit line current. At that time, by detecting the difference in rising speed of the potential in the bit line, data can be distinguished.

A third read-out system reads a difference between bit line currents that are different depending on "0" and "1" when the bit line BL is clamped to a predetermined potential. To read out the current difference, a current-voltage converting circuit is necessary. Finally, however, a sense output is issued through differential amplification of the potential difference.

In the present invention, in order to selectively write data "0", that is, to ensure that holes are emitted only from the bulk region of a memory cell selected by potentials of a selected word line WL and a bit line BL from the memory cell array, capacity coupling between the word line WL and the bulk region is essential. The state of data "1", with excessive holes stored in the bulk region, has to be maintained in the state where the word line WL is sufficiently biased to the negative direction, and the gate/bulk interstitial capacity of the memory cell becomes equal to the gate oxide film capacity (in which no depletion layer is formed on the surface).

Additionally, write operation is preferably effected by writing pulses for both "0" and "1" to save power consumption. Upon writing "0", although a hole current flows from the bulk region of the selected transistor to the drain and an electron current flows from the drain to the bulk region, it does not occur that holes are injected to the bulk region.

More concrete operation waveforms will be explained. FIGS. 8 through 11 show waveforms of read/refresh and read/write operations in case of using the first read-out system configured to distinguish data depending on the presence or absence of discharge to the bit line by the selected cell. Assume that the reference potential given to the fixed potential line SS commonly connecting the sources of all memory cells MC is o V.

Figure 8:
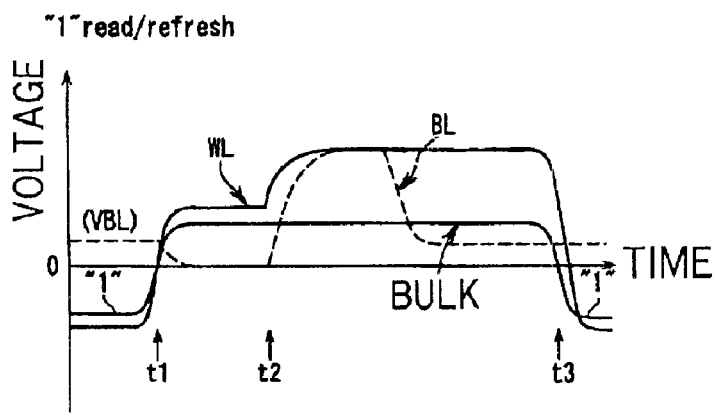
FIG. 8 shows waveforms of read/refresh operations of data "1" by the same DRAM cell.
Figure 9:
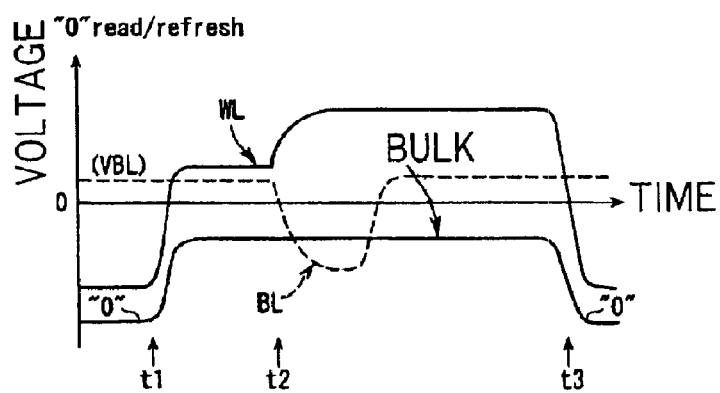
FIG. 9 shows waveforms of read/refresh operations data "0" by the same DRAM cell.

FIGS. 8 and 9 are waveforms of read/refresh operations of data "1" and data "0", respectively. Up to the time t1, the memory is in the data holding state (non-selected state), and the word line WL is supplied with a negative potential. At the time t1, the word line WL is raised to a predetermined positive potential. At that time, the word line potential is adjusted to a value between the threshold values Vth0 and Vth1 of data "0" and "1". As a result, in case of data "1", the precharged bit line VBL becomes a low potential due to a discharge. In case of data "0", the bit line potential VBL is maintained. Thereby, data "1" and "0" are distinguished.

At the time t2, potential of the word line WL is further raised, and at the same time, a positive potential is applied to the bit line BL (FIG. 8) when the read-out data is "1" whereas a negative potential is applied to the bit line BL (FIG. 9) when the read-out data is "0". As a result, if the data of the selected memory cell is "1", a large channel current flows and causes impact ionization, and excessive holes flow into the bulk region and have the memory write data "1" again. In case of data "0", the drain junction is forwardly biased, and holes are emitted from the bulk region and have the memory write data "0" again.

At the time t3, the word line WL is negatively biased, thereby to complete the read/refresh operations. In the other non-selected memory cells connected to the bit line BL commonly with the memory cell from which data "1" has been read out, since the word lines WL are held in negative potentials, that is, the bulk region is held in a negative potential, no channel current flows, and writing does not occur. Also in the other non-selected memory cells connected to the bit line BL commonly to the memory cell from which data "0" has been read out, the word line WL are held in negative potentials, and emission of holes does not occur.

Figure 10:
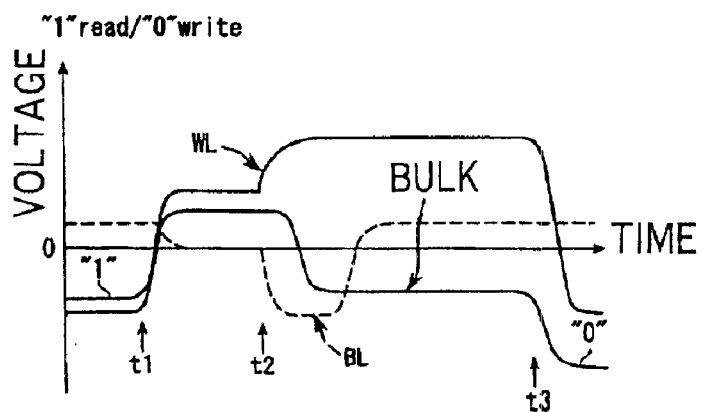
FIG. 10 shows waveforms of read operation of data "0" and write operation of data "1" by the same DRAM cell.
Figure 11:
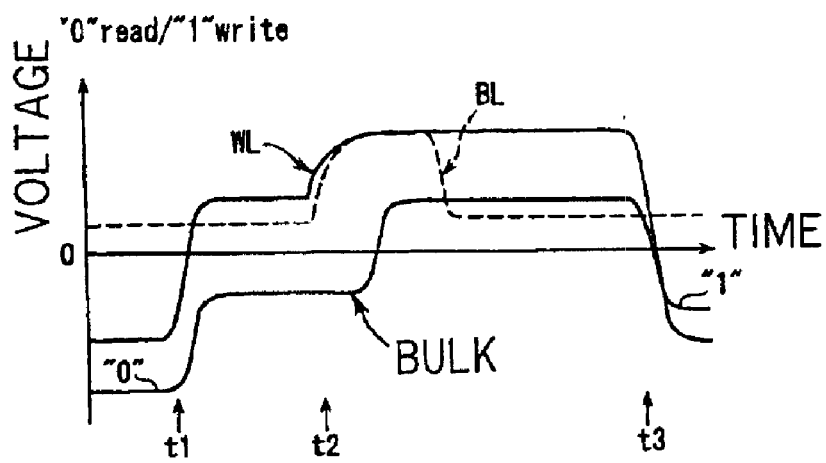
FIG. 11 shows waveforms of read operation of data "1" and write operation of data "1" by the same DRAM cell.

FIGS. 10 and 11 are waveforms of read/write operations of data "1" and data "0" by the same read-out system. Read-out operations at the time t1 in FIGS. 10 and 11 are the same as those of FIGS. 8 and 9, respectively. After reading, at the time t2, the word line WL is raised to a high potential, and in case of writing data "0" in the same selected cell, a negative potential is simultaneously applied to the bit line BL (FIG. 10). In case of writing data "1", a positive potential is applied to the bit line BL (FIG. 11). As a result, in the cell to which the data "0" is given, the drain junction is forwardly biased, and holes in the bulk region are emitted. In the cell to which the data "1" is given, a channel current flows, impact ionization occurs, and holes are accumulated in the bulk region.

As explained above, the DRAM cell according to the invention is made of SGT having the floating bulk region electrically isolated from others, and enables realization of the cell size of $4F^2$. In addition, potential control of the floating bulk region is attained by using the capacity coupling from the gate electrode, without using back gate control, and the source diffusion layer is fixed in potential as well. That is, control of read/write operations is easily accomplished only by the word line WL and the bit line BL. Furthermore, since the memory cell is basically can be read in a non-destructive mode, it is not necessary to provide the sense amplifier for each bit line, and layout of the sense amplifiers is easy. Moreover, because of the current read-out system, it has a resistance to noise, and reading is possible even in the open bit line system.

In addition, by utilizing SGT using the columnar silicon layer as the memory cell, a lot of effects are obtained. In the memory cell based on the operation principle according to the invention as explained above, it is desirable that the bulk potential changes faithfully following to the word line (gate electrode). Thereby, charges accumulated in the bulk region can be held without turning on the pn junction. In normal horizontal MOS transistors, capacity between the gate electrode, i.e. the word line, and the bulk region becomes smaller as the transistor is miniaturized, and the capacity of the source and drain pn junction cannot be disregarded.

In contrast, when the SGT structure is used, since the channel region surrounds the columnar silicon layer and the channel length is determined by the height of the columnar silicon layer, a large channel length can be obtained independently from the horizontal size determined by lithography. In other words, without increasing the horizontal area, a large channel length can be realized within substantially the same area as the bit line contact. Therefore, capacity coupling between the word line and the bulk region can be increased, and reliable operation control by controlling the bulk potential from the word line is ensured.

Further, in the memory cell according to the invention, it is desirable that the threshold value change largely relative to changes of the bulk potential. This can be also realized easily by employing the SGT structure. That is, by producing a concentration profile in the substrate in its thickness direction such that the substrate impurity concentration is high in a central portion of the channel and the channel concentration near the pn junction is low, changes of the threshold value relative to changes of the bulk potential can be enlarged by the substrate biasing effect while minimizing the junction leakage. furthermore, by reducing the top area of the columnar silicon layer for contact with the bit line, the pn junction capacity connected to the bit line can be reduced, and this also contributes to relatively increasing the capacity coupling ratio of the word line and the bulk region. Further, as a result, since the bit line capacity also decreases, the charge and discharge current of the bit line capacity upon read and write operations is diminished, and higher speed and lower power consumption are attained thereby.

A concrete manufacturing process of the cell array explained with reference to FIGS. 1 through 3 is next explained with reference to FIGS. 12 through 17 that are cross-sectional views corresponding to the cross-sectional view of FIG. 2, showing different steps of the manufacturing process.

Figure 12:
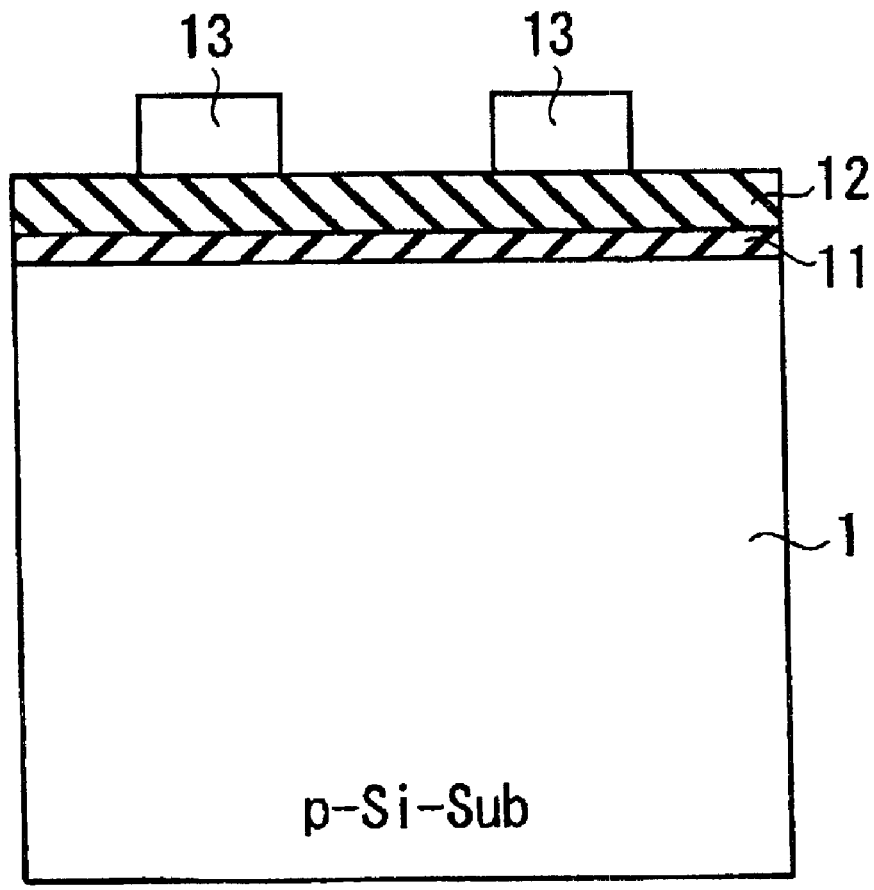
FIG. 12 is a diagram of the same DRAM cell array under its manufacturing process.

As shown in FIG. 12, after a buffering silicon oxide film 11 is formed to a thickness around 10 nm on a p-type silicon substrate 1, a silicon nitride film 12, approximately 200 nm thick, is formed thereon, and a resist 13 is formed and patterned thereon by lithography.

Figure 13:
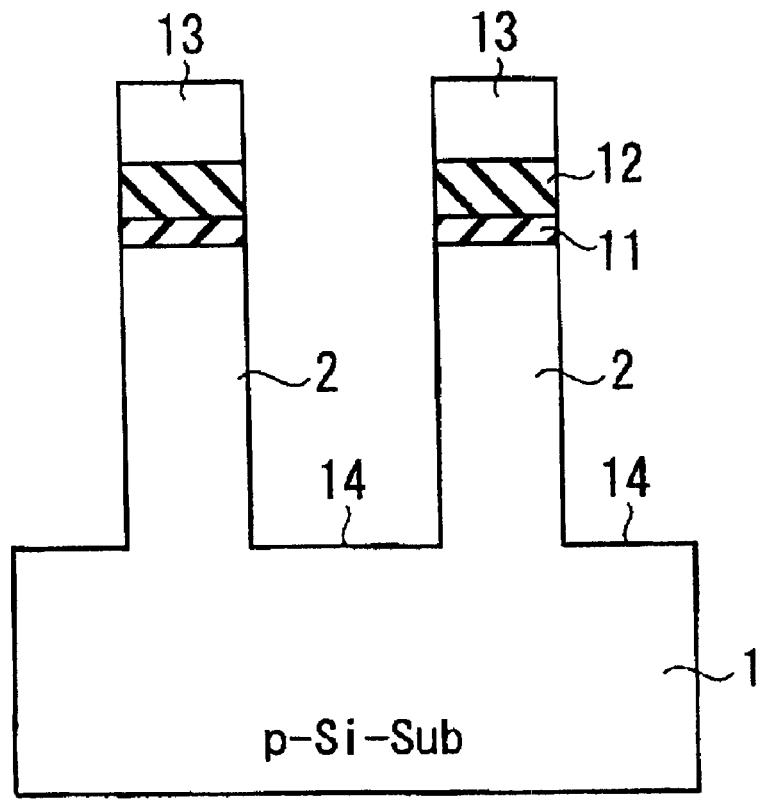
FIG. 13 is a diagram of the same DRAM cell array under its manufacturing process.
Figure 14:
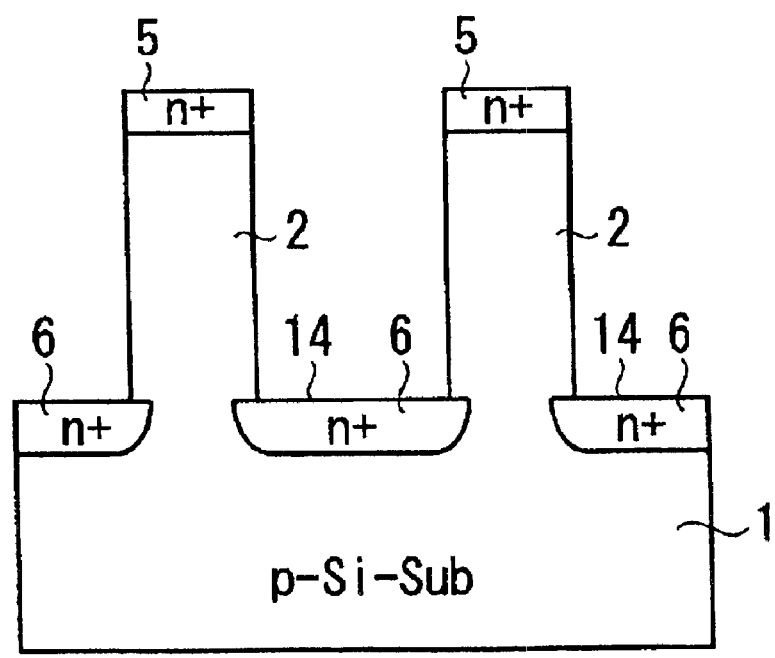
FIG. 14 is a diagram of the same DRAM cell array under its manufacturing process.

After that, as shown in FIG. 13, using the resist 13 as a mask, the silicon nitride film 12 and the silicon oxide film 11 are etched, and the silicon substrate 1 is further etched to make channels 14 extending in crossing directions and thereby form the columnar silicon layers 2. After than, the resist 13 and the silicon nitride film 12 are removed, As ions are implanted, and as shown in FIG. 14, diffusion layers 6, 5 to be used as sources and drains, respectively, are formed on tops of the channels 14 and the columnar silicon layers 2.

Figure 15:
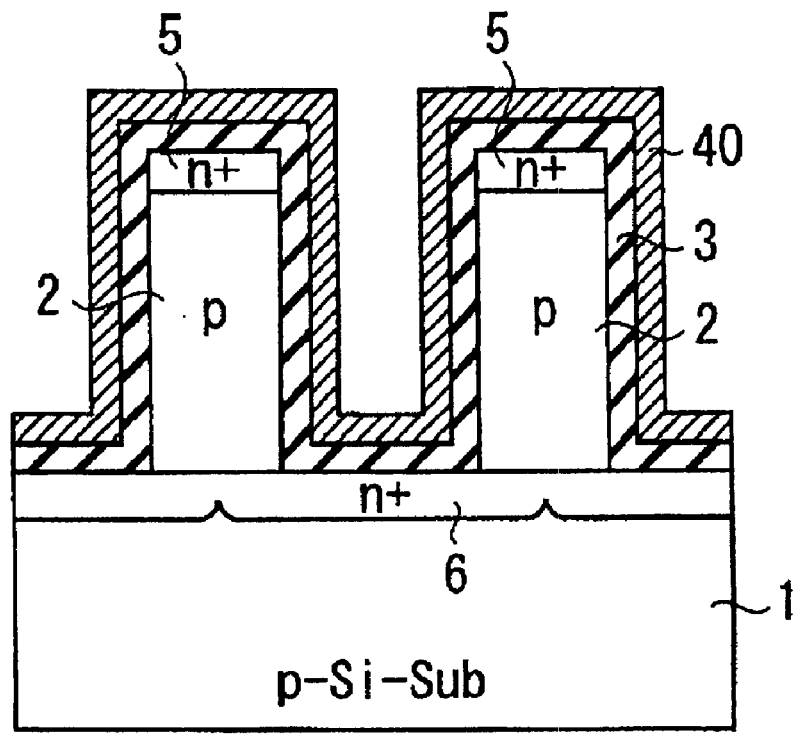
FIG. 15 is a diagram of the same DRAM cell array under its manufacturing process.

Thereafter, as shown in FIG. 15, a gate oxide film 3 is formed on and around the columnar silicon layers 2, by thermal oxidation, and a polycrystalline silicon film 40 for forming gate electrodes is formed subsequently. Through the thermal oxidation process including gate oxidation and subsequent thermal process, the $n^+$-type source diffusion layers 6 formed at bottoms of the channels 14 diffuse laterally. As a result, p-type regions of the columnar silicon layers 2 and p-type regions of the substrate 1 are electrically isolated by the source diffusion layer 6.

Figure 16:
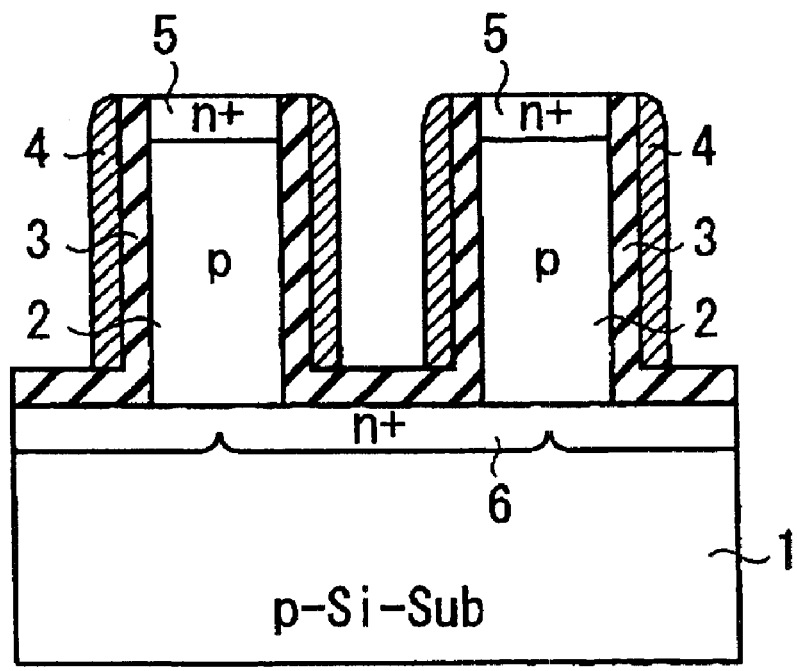
FIG. 16 is a diagram of the same DRAM cell array under its manufacturing process.

After that, the entire surface of the polycrystalline silicon film 40 is etched by RIE to form the gate electrodes 4 only on side walls of the columnar silicon layers 2 as shown in FIG. 16, In this etching process, however, spaces between the columnar silicon layers 2 aligned in the direction orthogonal to the sheet of FIG. 16 are covered with a resist. As a result, as shown in FIGS. 1 and 3, word lines 9 are made of the same polycrystalline silicon film 40 to connect the gate electrodes 4.

Figure 17:
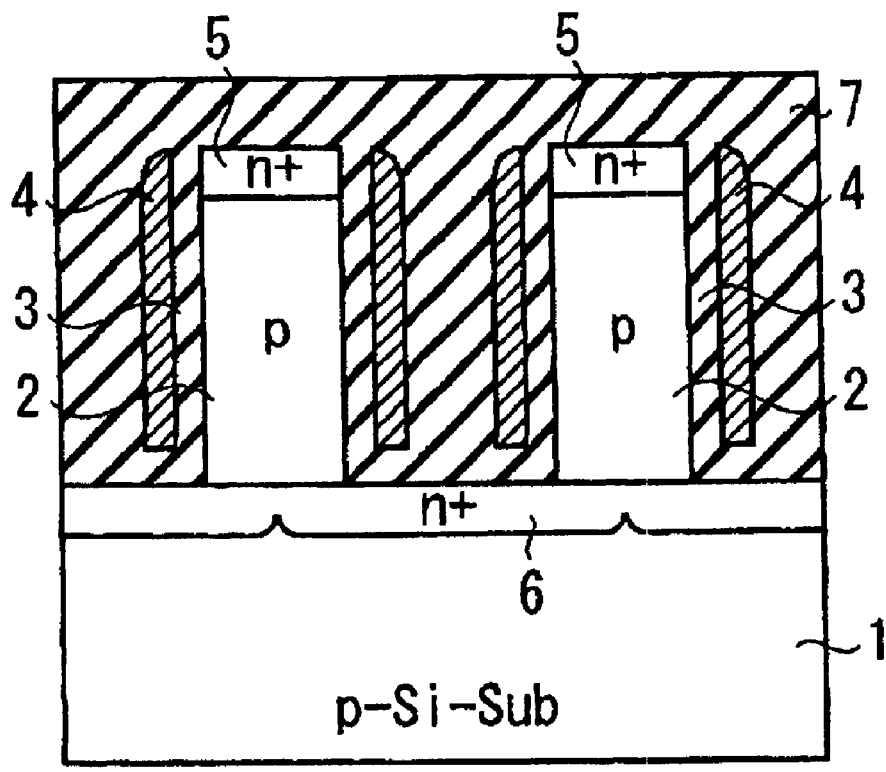
FIG. 17 is a diagram of the same DRAM cell array under its manufacturing process.

After that, a silicon oxide film is formed as shown in FIG. 17, and it is leveled by CMP to form the inter-layer insulating film 7. Subsequently, after contact holes are formed at positions of the columnar silicon layers 2, an Al film is formed and patterned to form bit lines 8, as shown in FIG. 2. Usable as the bit lines 8 are other metal films of W, etc., for example, instead of the Al film, or films of other conductive materials, such as or polycrystalline silicon. Thereafter, although not shown, an inter-layer insulating film is formed to make wirings for connection to peripheral circuits. The source diffusion layer 6 formed at bottoms of the columnar silicon layers 2 is connected to a signal line fixed in potential, such as a grounded line, at a peripheral portion of the cell array.

Through the manufacturing processes explained above, a cell array composed of single-transistor memory cells having the SGT structure using a small cell area and ensuring a large gate capacity can be obtained.

Figure 18:
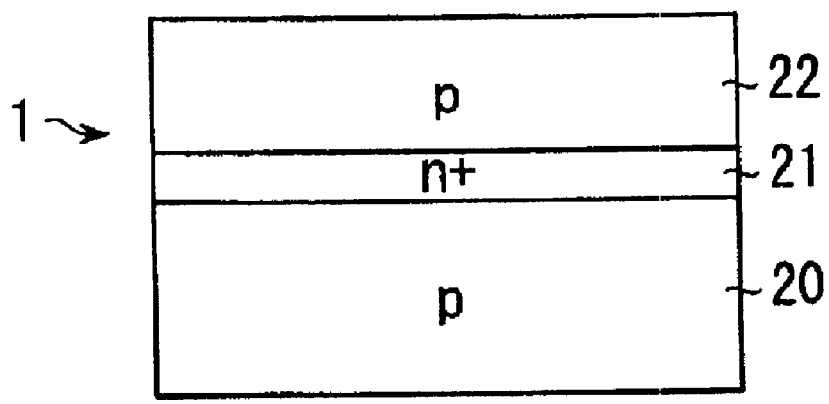
FIG. 18 is a diagram that shows a further substrate structure.

In the example explained above, the columnar silicon layers 2 are completely isolated electrically from the substrate by using lateral diffusion of the source diffusion layer 6. This is easy when the diameter of each columnar silicon layer 2 is sufficiently small, but it is not always easy when the diameter is relatively large. In that case, it is desirable that an $n^+$-type layer to be used as the source diffusion layer 6 is built in the substrate beforehand. That is, a structure as shown in FIG. 18 is previously prepared as the silicon substrate 1.

This structure can be obtained, for example, by using a p-type layer 20 as the substrate, then forming an $n^+$-type buried layer 21 on the entire surface of the p-type layer 20, and next epitaxially growing a p-type silicon layer 22. Alternatively, the substrate of FIG. 18 can be made by preparing independent silicon substrates as the p-type layers 20, 21, then forming the $n^+$-type layer 21 on one of them, and thereafter bonding them directly. Using such an epitaxial substrate or a bonded substrate, once the columnar silicon layers are formed by etching the substrate to the depth of the $n^+$-type layer 21, reliable electric isolation between the columnar silicon layers and the substrate is ensured.

Figure 19:
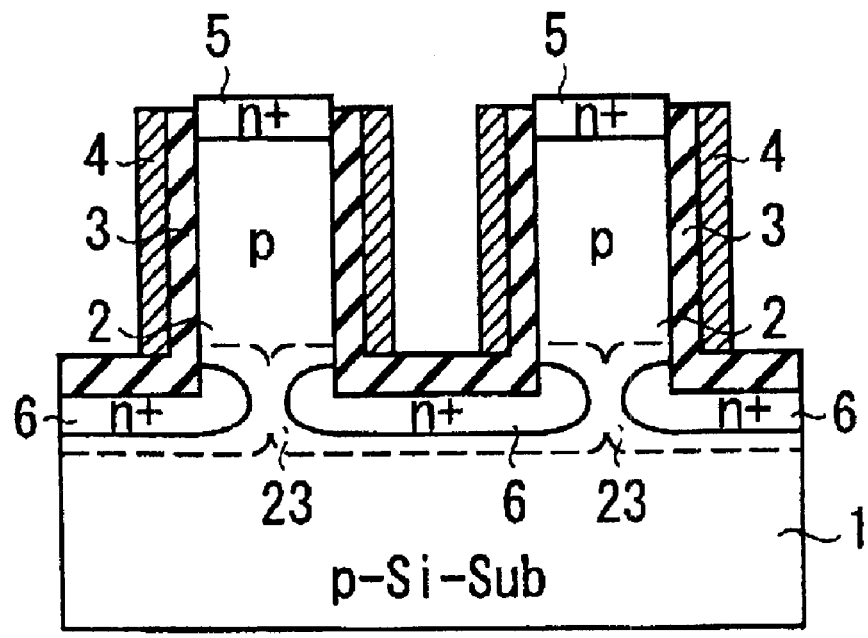
FIG. 19 is a cross-sectional view of a further DRAM cell array.

It is not indispensable that bottoms of the columnar silicon layers are completely closed by the $n^+$-type layer 6. For example, as shown in FIG. 19, even when the $n^+$-type layers 6 extending from bottoms of the channels do not completely traverse the columnar silicon layers 2, only if the depletion layers 23 extending from portions encircling the columnar silicon layers 2 toward their centers connect to each other under zero bias, p-type regions of the columnar silicon layers 2 and p-type regions of the substrate 1 are electrically isolated.

Figure 20:
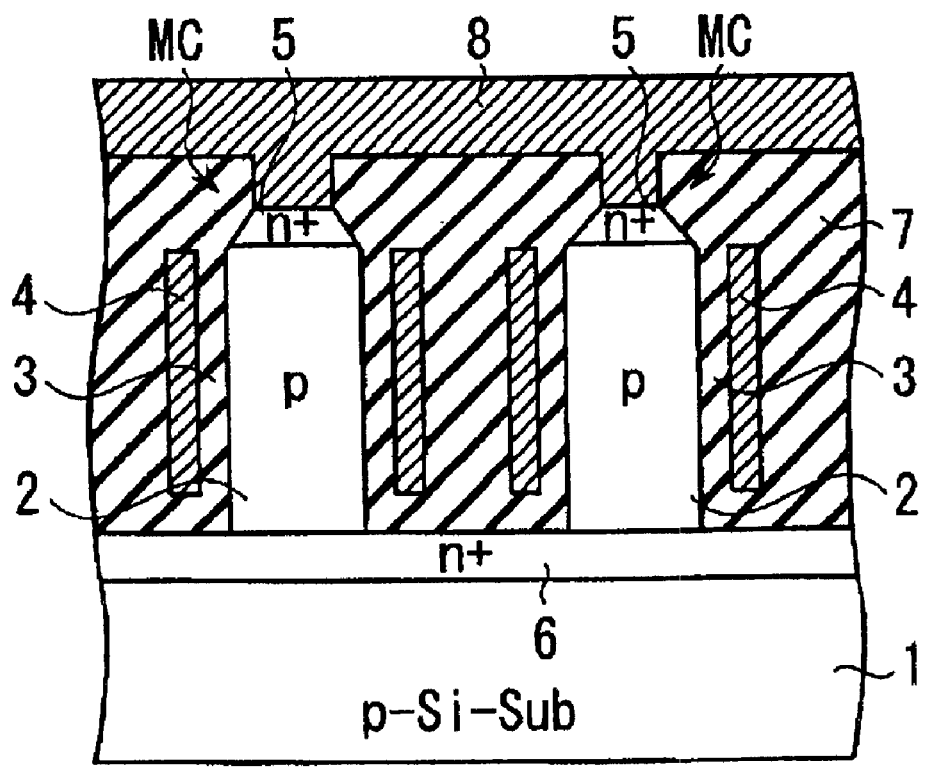
FIG. 20 is a cross-sectional view of a further DRAM cell array.

FIG. 20 shows a cross section of another cell array structure, which corresponds to FIG. 2. In this example, top portions of the columnar silicon layers 2 are tapered to diminish the diameter toward the tops. In this manner, contact area of each drain diffusion layers 5 formed on top ends of the columnar silicon layers 2 with the bit line 8 can be reduced.

In the examples explained heretofore, junction between the $n^+$-type source region 6 and the drain diffusion layers 5 with the p-type silicon layer 2 is preferably graded junction in which the $n^+$-type layer joins the p-type layer via an n-type layer gradually decreased in concentration, instead of step-like junction. In this manner, junction leakage can be reduced, and the junction capacity can be reduced as well. Even when this junction structure is used, since the height of the columnar silicon layers ensure the channel length, unlike the horizontal transistors, a sufficiently high p-type impurity concentration can be ensured in the central portions of the channels. Therefore, it is convenient for dynamic recording operation by bulk potential control using the gate capacity.

Second Embodiment

Figure 21:
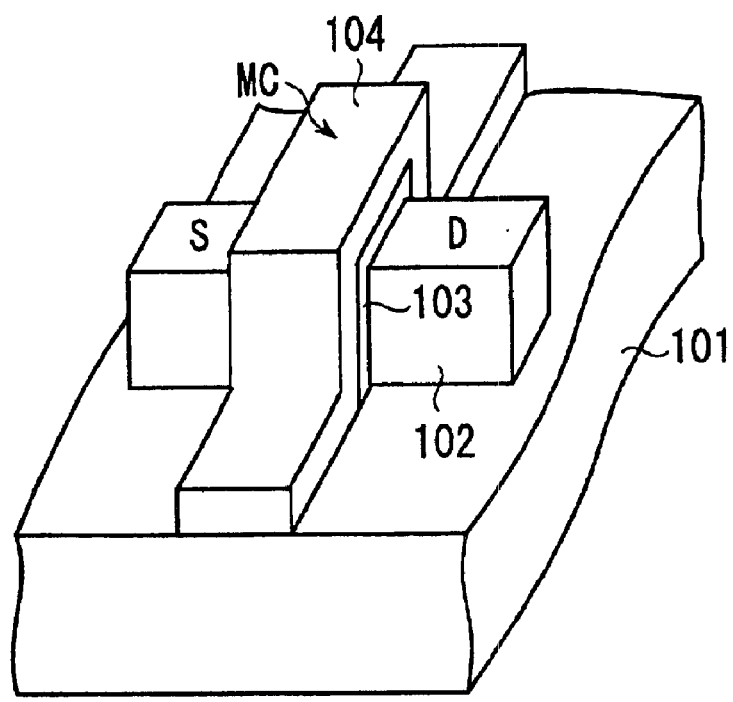
FIG. 21 is a diagram that shows a memory cell structure according to a further embodiment.

The first embodiment has been explained above as using as memory cells MC the transistors having the SGT structure in which side wall surfaces of the columnar silicon layers are used as channel regions. In contrast, although using, a single transistor in form of a columnar silicon layer as each memory cell MC, the second embodiment has the transistor shown in FIG. 21. That is, a columnar silicon layer 102 formed on a silicon substrate 101 is used as an active layer, a gate electrode 104 is provided to lie across the columnar silicon layer 102 and oppose to the top surface and opposite side surfaces of the columnar silicon layer 102 via a gate insulating film 103, and drain and source diffusion layers are formed at opposite sides of the gate electrode 104. The columnar silicon layer 102 is held floating by an insulating film buried at the bottom thereof.

Figure 22:
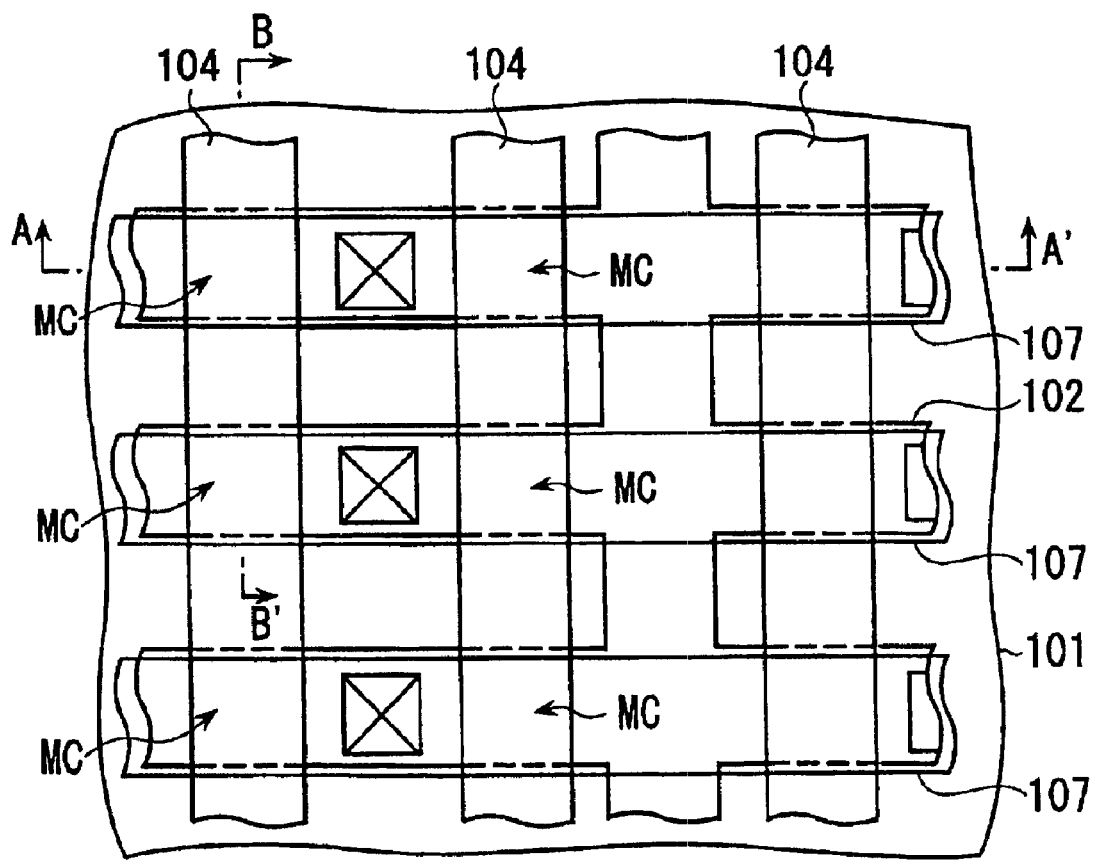
FIG. 22 is a diagram that shows a layout of a DRAM cell array according to the same embodiment.
Figure 23:
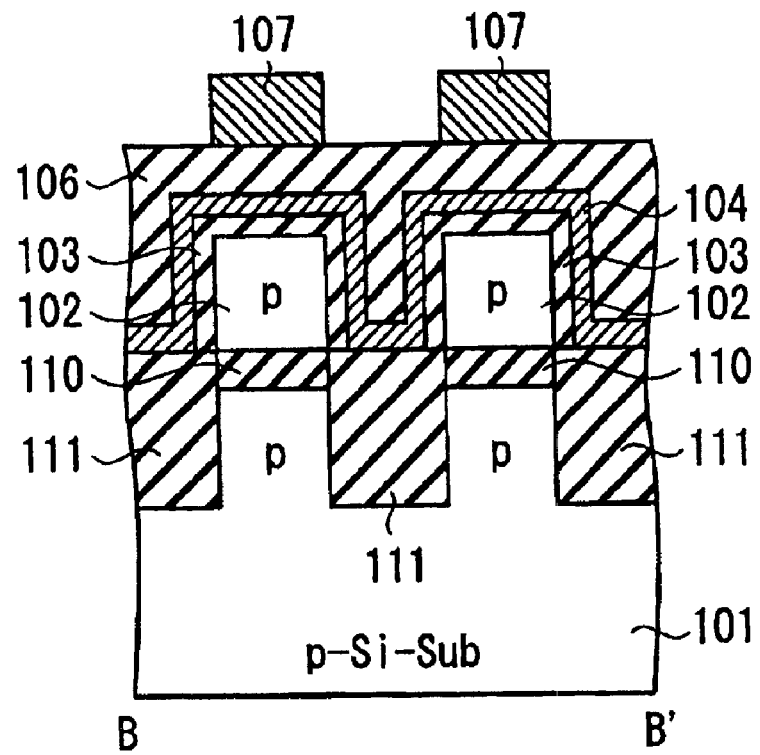
FIG. 23 is a cross-sectional view taken along the B–B' line of FIG. 22.
Figure 24:
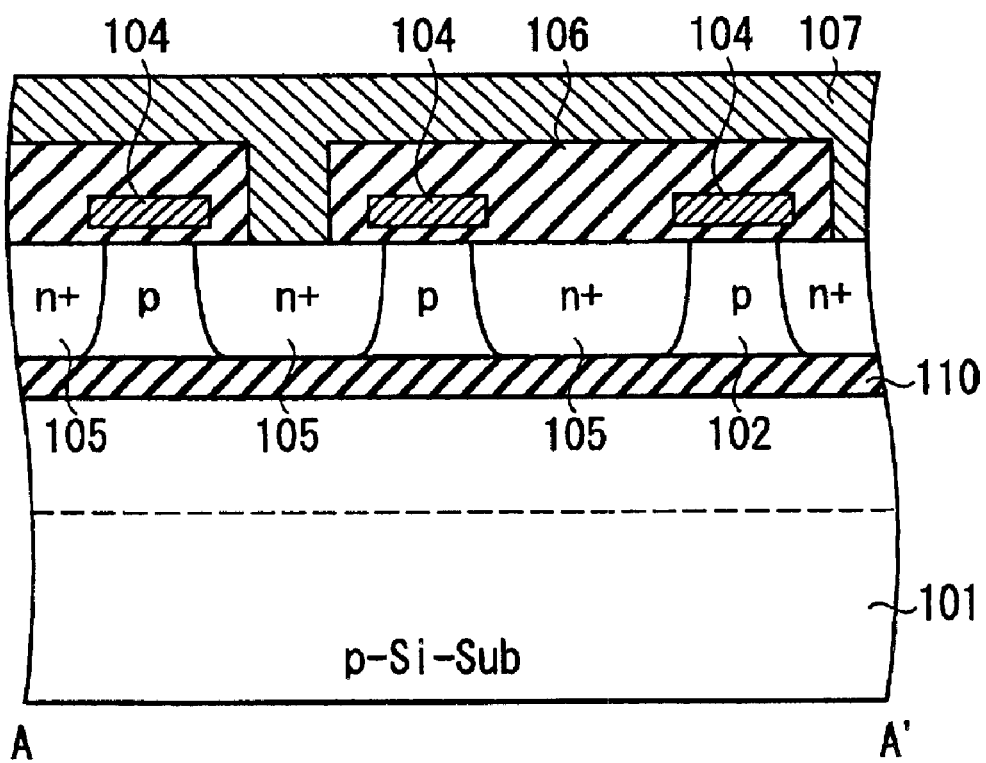
FIG. 24 is a cross-sectional view taken along the A–A' line of FIG. 22.

FIG. 22 shows a layout of a DRAM cell according to the instant embodiment, and FIGS. 23 and 24 are cross-sectional views taken along the A–A' and B–B' lines of FIG. 22. As explained later, used as the columnar silicon layer 102 is a p-type silicon layer epitaxially grown on the silicon substrate 101. Active layer 102, which are convex silicon layers obtained by processing the p-type silicon layer, are arranged in a pattern of a grating such that each drain diffusion layer is shared by active layers 102 of different memory cells MC adjacent to each other in the bit line direction and the source diffusion layer is continuously formed in the word line direction as a common source line.

At the bottom of each active layer 102, a silicon oxide film 110 is buried. A silicon oxide film 111 is buried also in each device isolating region. Then, the gate electrode 104 is formed as a word line that lies across the active layer 102 and opposes to its three surfaces, the n⁺-type source and drain diffusion layer 105 are formed in self alignment with the gate electrode 104. The surface having formed the transistors is covered with an inter-layer insulating film 106, and bit lines 107 are formed thereon.

In this manner, operation principle of the DRAM cell array using a single NMOS transistor as each memory cell MC is the same as that of the foregoing first embodiment. As already explained with the first embodiment, magnitude of the capacity coupling from the gate electrode to the floating bulk region is important for data write/read operations. Also in this embodiment, since the gate electrode 104 is opposed to three surfaces of the active layer 102 made of the columnar silicon layer, a large coupling capacity is obtained, and a favorable property is obtained.

Figure 25:
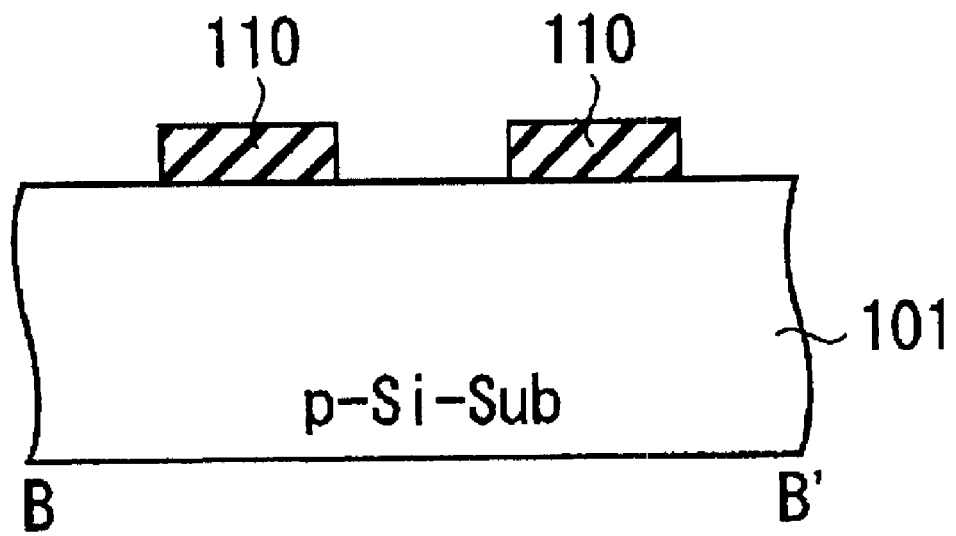
FIG. 25 is a diagram of the same DRAM cell array under its manufacturing process.
Figure 26:
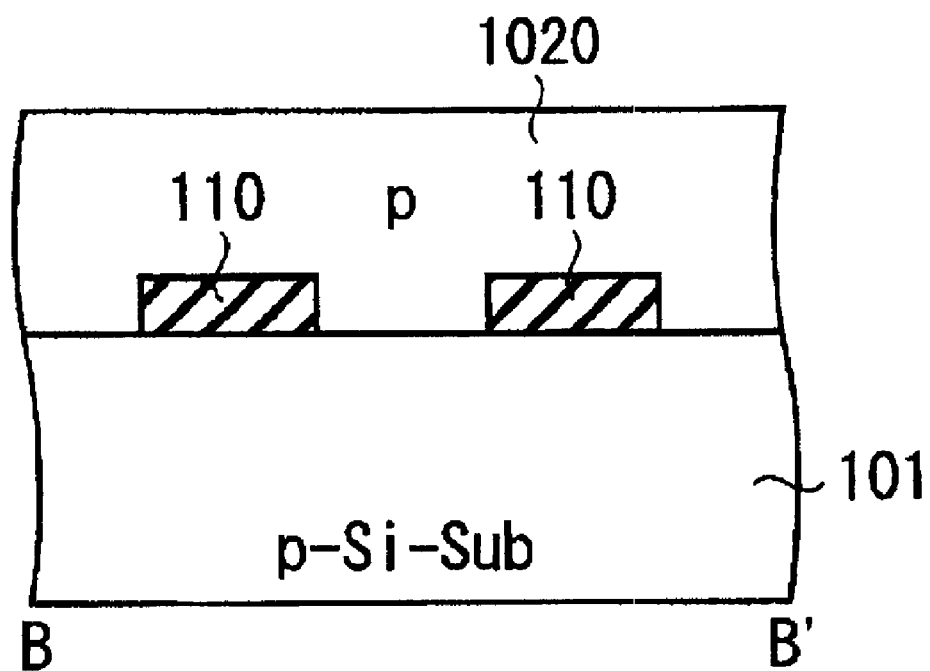
FIG. 26 is a diagram of the same DRAM cell array under its manufacturing process.

A manufacturing process for obtaining the cell array structure according to the second embodiment is next explained with reference to FIG. 25 et seq., which show the cross section corresponding to the cross section shown in FIG. 23. As shown in FIG. 25, the silicon oxide film 110 is formed on locations of silicon substrate 101 where silicon layers should be formed later as active regions having a grating pattern, with a certain tolerance for misalignment. Thereafter, as shown in FIG. 26, a p-type silicon layer 1020 is epitaxially grown on the silicon substrate 101.

Figure 27:
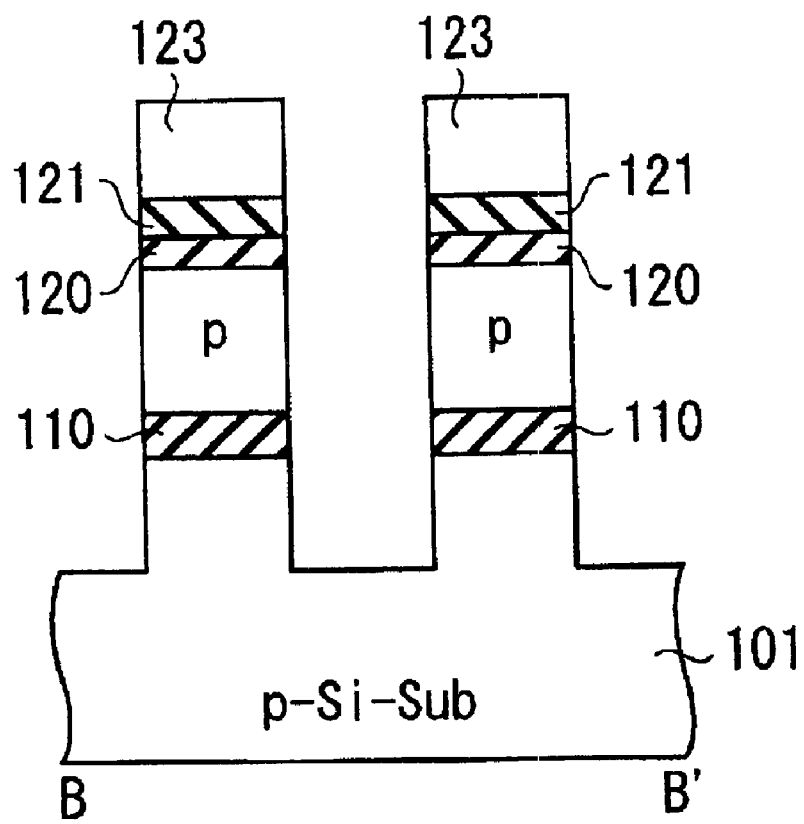
FIG. 27 is a diagram of the same DRAM cell array under its manufacturing process.

Next as shown in FIG. 27, a buffering silicon oxide film 120 and a silicon oxide film 121 are formed on the silicon layer 1020, and a resist 123 is formed and patterned thereon to cover the regions to be used as active regions by lithography. By RIE using this resist pattern 123, the silicon nitride film 121, silicon oxide film 121 and silicon layer 1020 are etched sequentially. Consecutively, the silicon oxide film 110 is etched and the exposed silicon substrate 101 is also etched to a predetermined depth.

Figure 28:
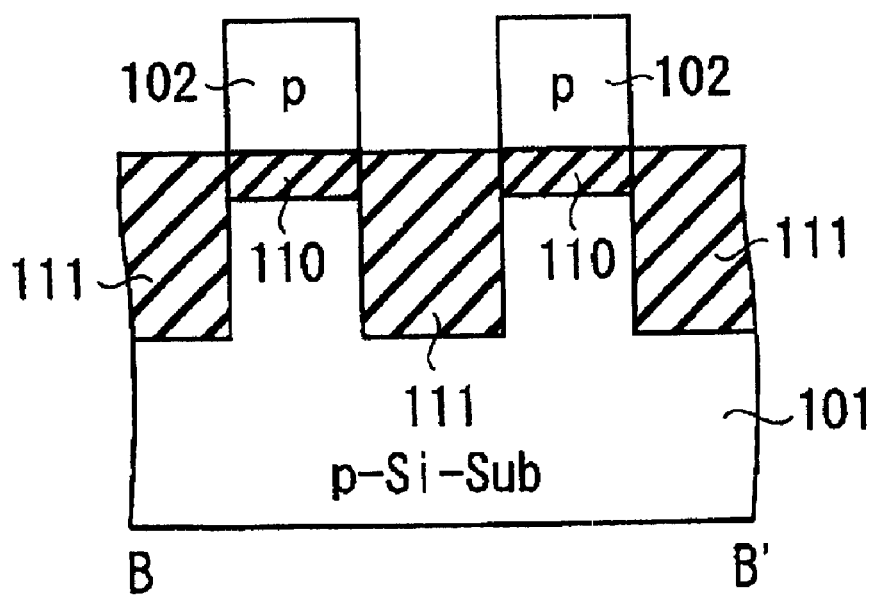
FIG. 28 is a diagram of the same DRAM cell array under its manufacturing process.

As a result, the active layer 102 having a convex grating pattern of the p-type silicon layer 1020, which is the epitaxially grown layer, is obtained. At the bottom thereof, the silicon oxide film 110 is buried. Thereafter, by forming the silicon oxide film 111, leveling it by CMP, and processing it by etch-back using RIE, the configuration where the silicon oxide film 111 is buried approximately up to the surface level of the silicon oxide film 110 is obtained as shown in FIG. 28. The silicon oxide film 111 is used as the device isolating insulation film for isolating respective transistors in their lateral direction.

Figure 29:
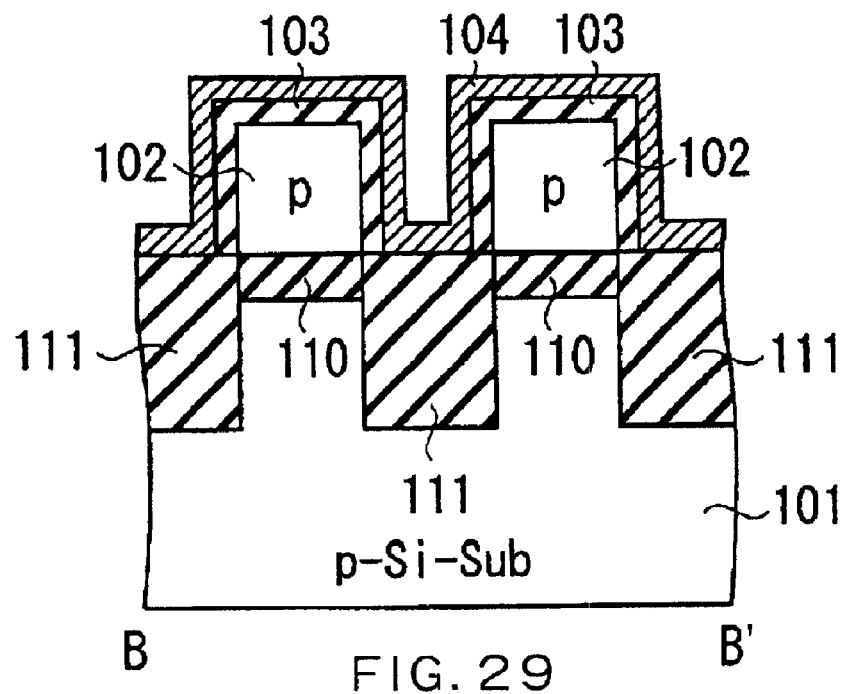
FIG. 29 is a diagram of the same DRAM cell array under its manufacturing process.
Figure 30:
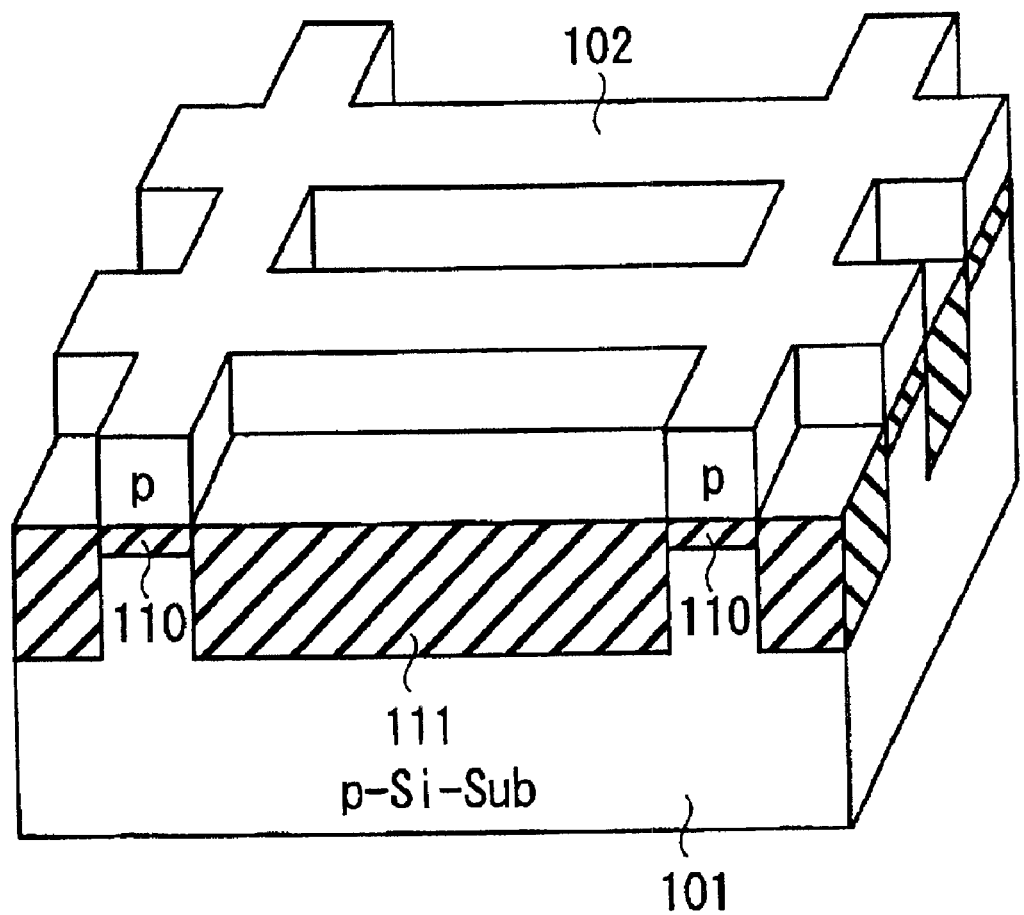
FIG. 30 is a perspective of the structure obtained through the process of FIG. 28.

The configuration shown in FIG. 28 is illustrated in a perspective view in FIG. 30. The p-type active layer 102 is shaped into a grating pattern, and the device isolating insulation film is buried in spaces. Subsequently, as shown in FIG. 29, after the gate insulating film 103 is formed on surfaces of the p-type active layer 102 (three surfaces including the top surface and opposite side surfaces), a polycrystalline silicon film is formed and patterned to form the gate electrodes 104 which will become the word lines.

After that, as shown in FIG. 24, using the gate electrodes 104 as a mask, As ions are injected to form the source and drain diffusion layers 105. These diffusion layers 105 herein has a depth enough to reach the buried silicon oxide film 110 as shown in FIG. 24. As a result, the p-type bulk region of the transistors can be held floating to be independently controlled in potential. Thereafter, the inter-layer insulating film 106 is formed, contact holes are formed in locations thereof corresponding to the drain diffusion layers, and bit lines 107 are formed to intersect with the word lines.

Third Embodiment

Figure 31:
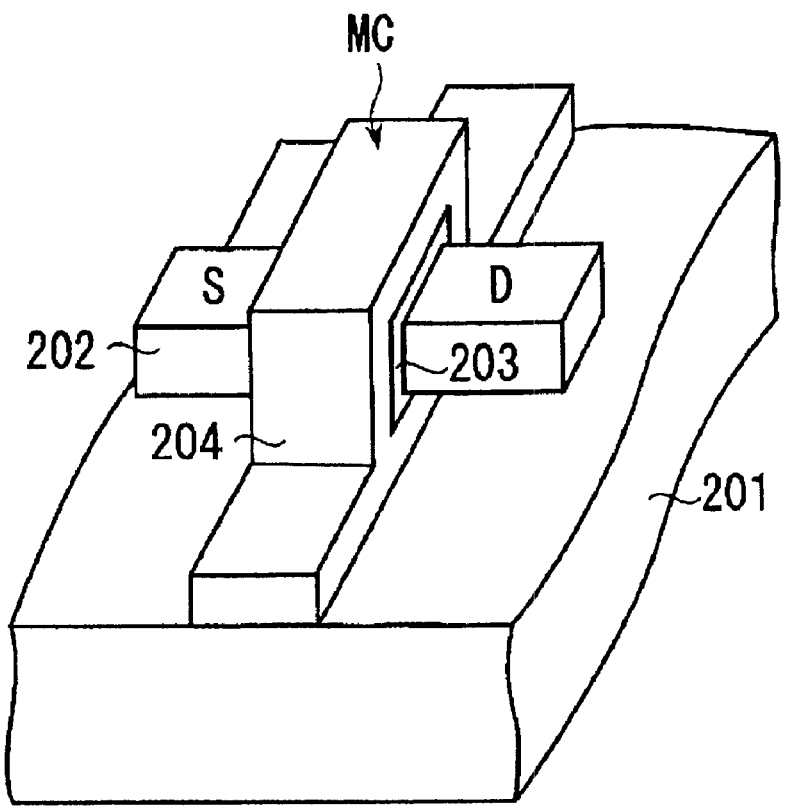
FIG. 31 is a diagram that shows a memory cell structure according to a still further embodiment.

FIG. 31 shows an embodiment using still another transistor structure to make up memory cells MC. On top, bottom and opposite side surfaces of an active layer 202 formed on a silicon substrate 201, a gate insulating film 203 is formed, and a gate electrode 204 is formed to lie across the active layer 202 and oppose to the top, bottom and opposite side surfaces of the active layer 202. At opposite sides of the gate electrode 204, source and drain diffusion layers are formed. FIG. 31 illustrates the active layer 202 as floating from the substrate 201. Actually, however, this structure is made by using a technique of making holes inside a silicon substrate as explained later, and the active layer 202 is not floating.

Here again, the DRAM cell array is made by using a single NMOS transistor as each memory cell MC, write and read operations of data are effected in the same manner as the first and second embodiments. Also in this case, as already explained with reference to the first embodiment, magnitude of the capacity coupling from the gate electrode to the floating bulk region is important for data write/read operations. Since the gate electrode 204 is opposed to the top and bottom surfaces of the active layer 202 mad of the columnar silicon layer, a large coupling capacity is obtained, and a favorable property is obtained.

Figure 32A:
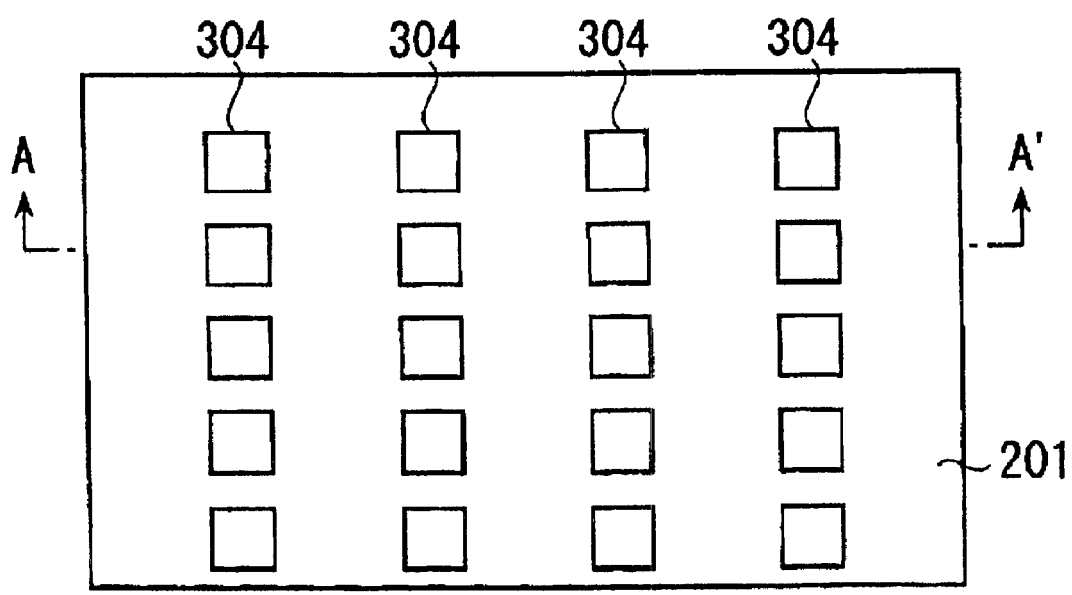
FIG. 32A is a plan view that shows a pretreatment process of a substrate according to the same embodiment.
Figure 32B:
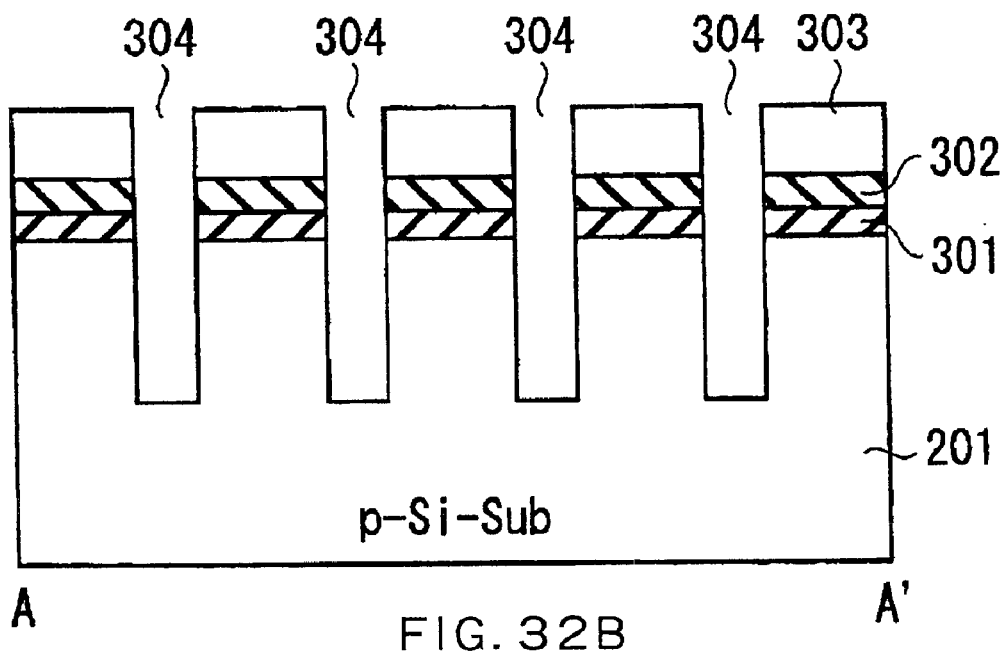
FIG. 32B is a cross-sectional view taken along the A–A' line of FIG. 32A.

A manufacturing method of the DRAM cell array according to the third embodiment is explained below in greater detail with reference to FIG. 32A et seq. First, pipe-shaped voids are formed in the silicon substrate 201. For this purpose, as shown in FIG. 32A and its A–A' cross-sectional view, FIG. 32B, a number of trenches 304 are formed in the silicon substrate 201 to extend in the word line directions in regions for forming word lines later in by using the same technique as used for trench-type DRAM. More specifically, a buffering silicon oxide film 301, silicon nitride film 302 are formed, a resist 303 is formed and patterned thereon, and the silicon substrate 201 is etched by RIE, thereby to make the trenches 304. The trenches 304 are arrange densely in the word line direction and thinly in the direction orthogonal thereto. Depth of each trench 304 is several times its diameter.

Figure 33A:
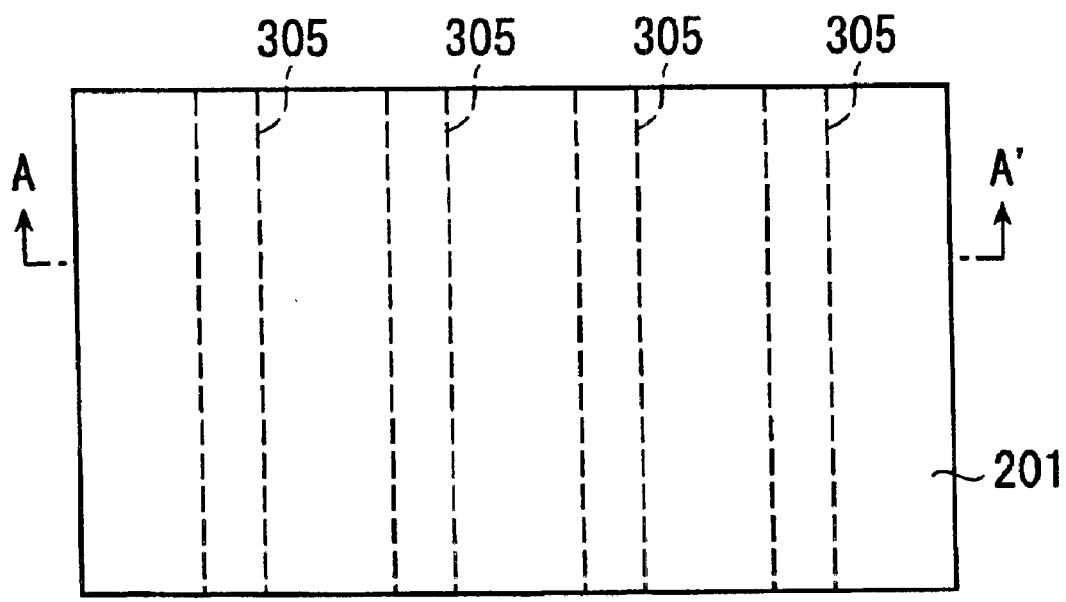
FIG. 33A is a plan view that shows a pretreatment process of a substrate according to the same embodiment.
Figure 33B:
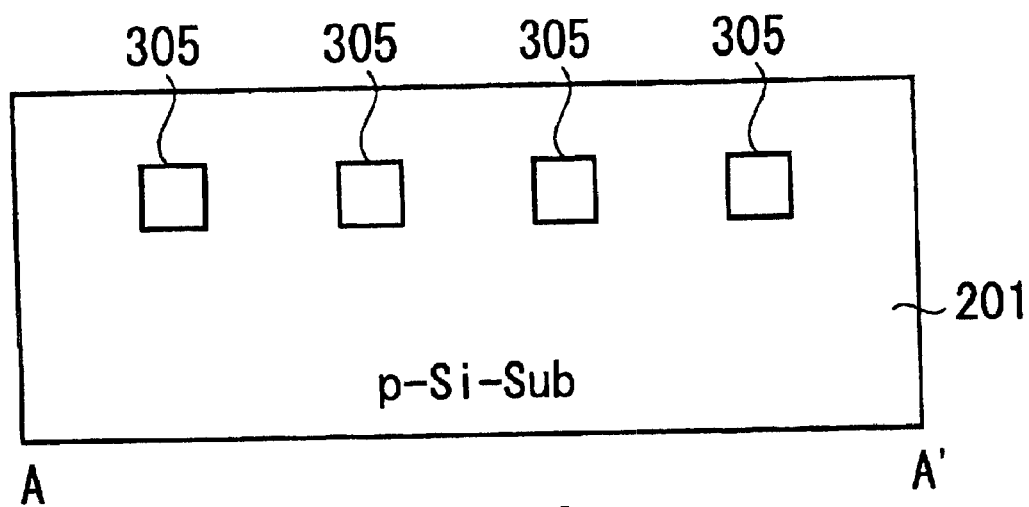
FIG. 33B is a cross-sectional view taken along the A–A' line of FIG. 33A.

Then, after the resist 303 is removed and the silicon nitride film 302 and the silicon oxide film 301 are removed as well, the substrate is annealed in a hydrogen atmosphere approximately at 1100° C. In this process, surface migration occurs, and due to movements of silicon atoms, openings of the trenches 30-4 are closed, and here is obtained a structure having a plurality of buried voids 305 in which voids are aligned continuously in form of pipes in the direction where the trenches are densely arranged. FIGS. 33A and 33B show the layout of this state and its A–A' cross-section.

The technique making pipe-shaped voids inside the silicon substrate in this manner is taught in detail in the paper disclosed by T. Sato et al, "A New Substrate Engineering for Formation Empty Space in Silicon (ESS) Induced by Silicon Surface Migration" (IEDM 199, Technical Digest, pp. 517–520).

Figure 34:
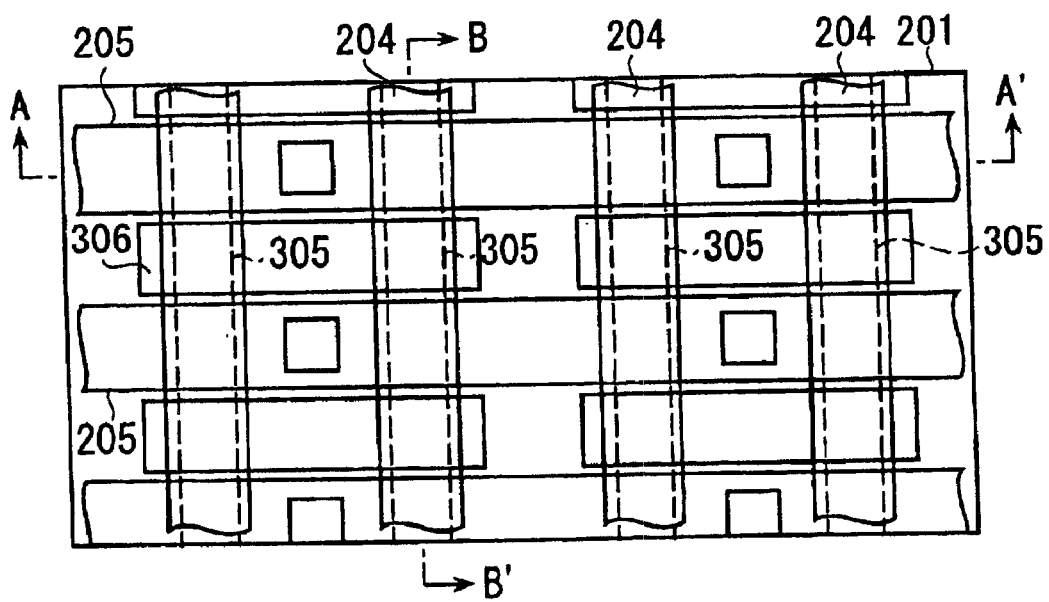
FIG. 34 is a plan view of a DRAM cell array according to the same embodiment.

In this manner, using the silicon substrate 201 having buried voids 304, as shown in FIG. 34, active regions partitioned in a grating form by the device isolating region 306 are formed to obtain a cell array having the word lines 204 overlapping the voids 305 and the bit lines 204 extending orthogonally thereto. More specifically, a part of the manufacturing process from the device isolating process to the device forming process is explained below with reference to FIG. 35A, FIGS. 35B through 39A and 39B which are A–A' cross-sectional views and B–B' cross-sectional views of FIG. 34, respectively.

Figure 35A:
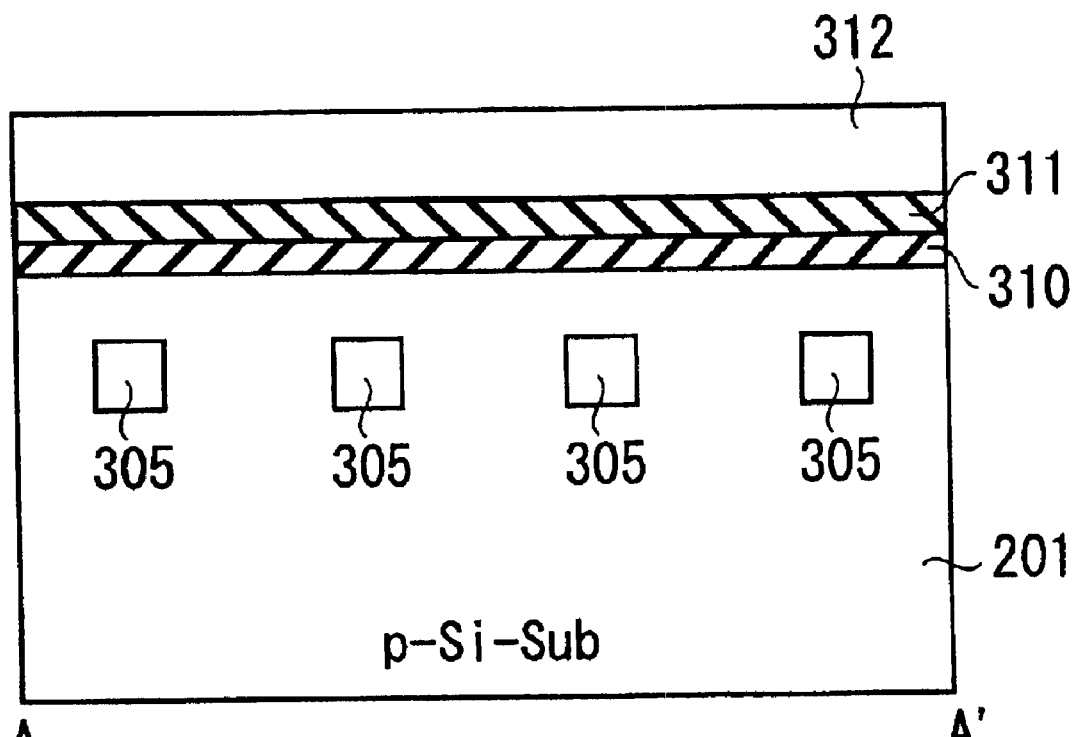
FIG. 35A is a cross-sectional view taken along the A–A' line of FIG. 34 to show a manufacturing process of the same embodiment.
Figure 35B:
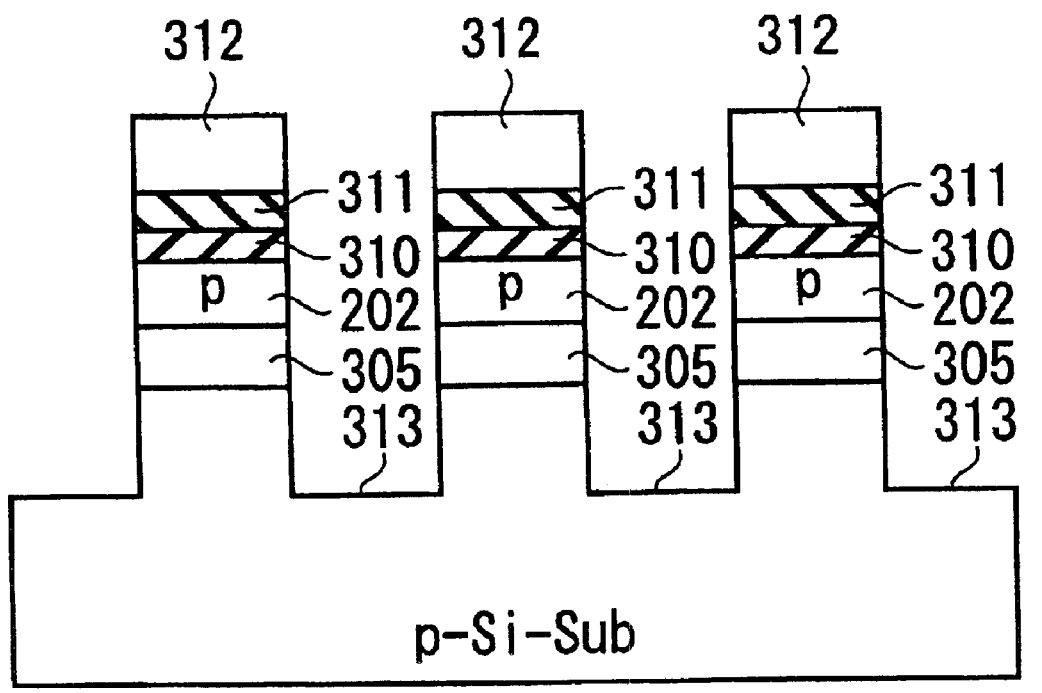
FIG. 35B is a cross-sectional view taken along the A–A' line of FIG. 34 to show a manufacturing process of the same embodiment.

First referring to FIGS. 35A and 35B, the silicon oxide film 310 and the silicon nitride film 311 are formed, and a resist 312 is formed and patterned thereon to cover the active layer regions. Then, the silicon nitride film 311 and the silicon oxide film 310 are etched by RIE, and the silicon substrate 201 is etched as well, thereby to form the device isolating channels 313. The device isolating channels 313 are formed to be deeper than the voids 305. As a result, the columnar (convex) active layers 202 in which the voids 305 transversely pass through are formed in respective transistor forming regions. Actually, the active layers 202 are formed in a grating-shaped continuous pattern similarly to the second embodiment to form each drain diffusion layer to be shared by transistors adjacent in the bit line direction and to form each source diffusion layer to be shared by transistors adjacent in the word line directions.

Figure 36A:
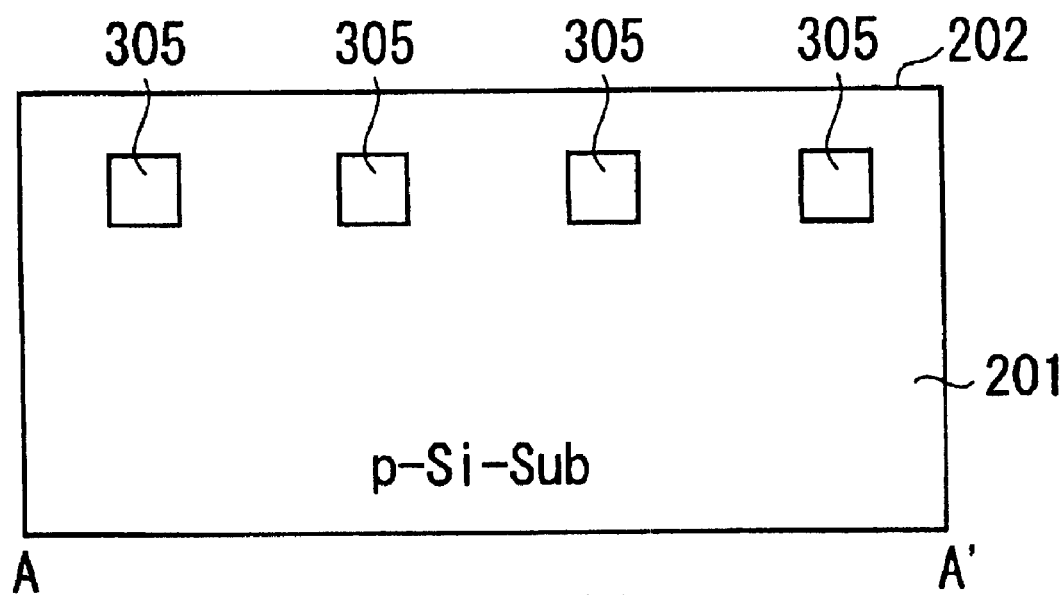
FIG. 36A is a cross-sectional view taken along the A–A' line of FIG. 34 to show a manufacturing process of the same embodiment.
Figure 36B:
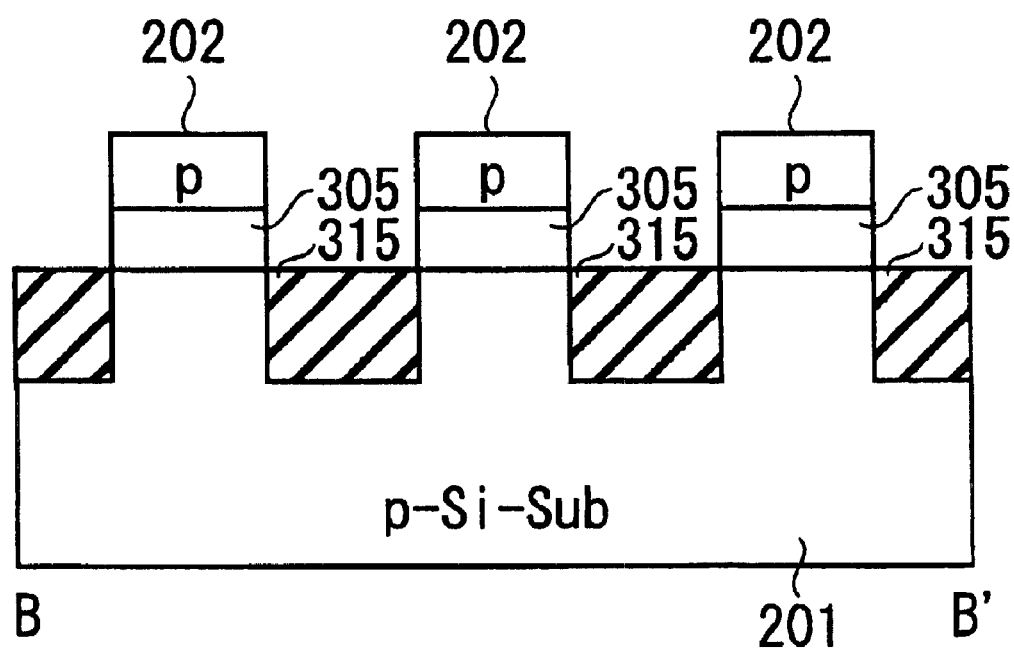
FIG. 36B is a cross-sectional view taken along the A–A' line of FIG. 34 to show a manufacturing process of the same embodiment.

After that, as shown in FIGS. 36A and 36B, the silicon nitride film 311 and the silicon oxide film 310 are removed by etching, and another silicon oxide film 315 is formed and processed by etch-back to obtain a structure where the silicon oxide film 315 is buried in the device isolating channels 313 to function as device separating insulation films. Surfaces of the silicon oxide films 315 are approximately aligned with bottoms of the voids 305 not to close openings of the voids 305 passing through the active layers 202.

Figure 37A:
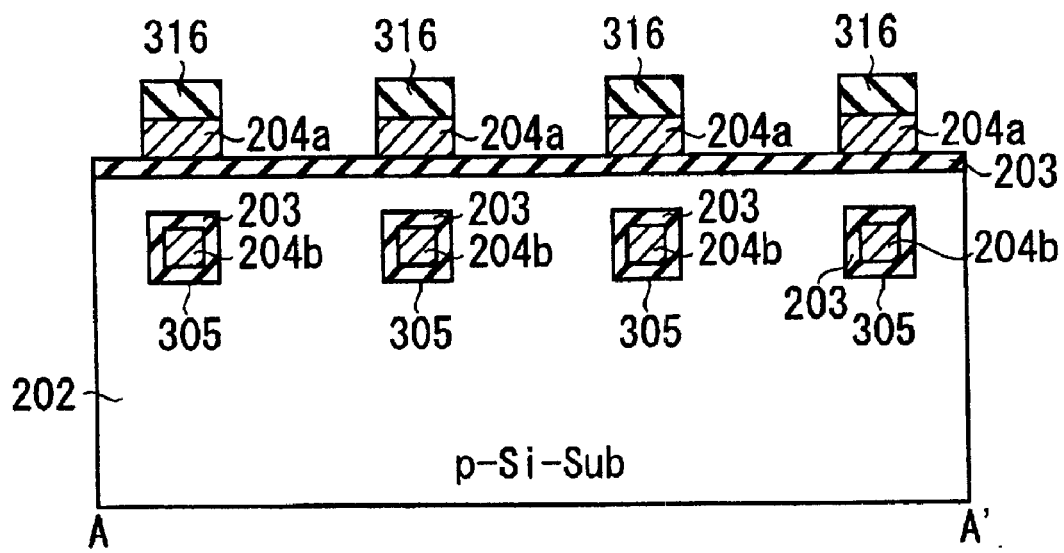
FIG. 37A is a cross-sectional view taken along the A–A' line of FIG. 34 to show a manufacturing process of the same embodiment.
Figure 37B:
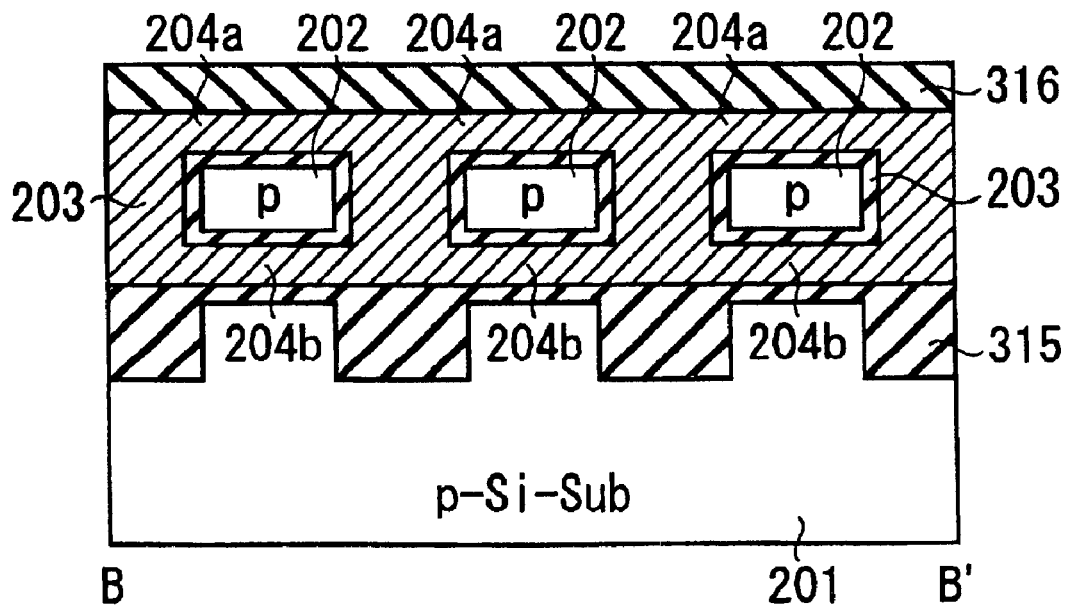
FIG. 37B is a cross-sectional view taken along the A–A' line of FIG. 34 to show a manufacturing process of the same embodiment.

After that, as shown in FIGS. 37A and 37B, a gate insulating film 203 is formed, and a gate electrode 204 made of a polycrystalline silicon film to be used as word lines are formed and patterned along the voids 305. The top surface of the gate electrode 204 is kept covered by the silicon nitride film 316. The gate insulating film 203, when formed by thermal oxidation, is formed not only on the top surface of the active layer 202 but also on inner walls of the voids 305. The gate electrode 204 is buried also in the voids 305. That is, gate electrode portions 204a formed on the top surface of the active layer 202 and the gate electrode portions 204b buried in the voids 305 are connected at end portions of the voids 305 to extend continuously as word lines. In other words, transistors are formed having the top and bottom surfaces and continuous side surfaces of the active layer 202 as their channels. This transistor structure is a SGT structure rotated by 90° C. from that of the first embodiment.

Figure 38A:
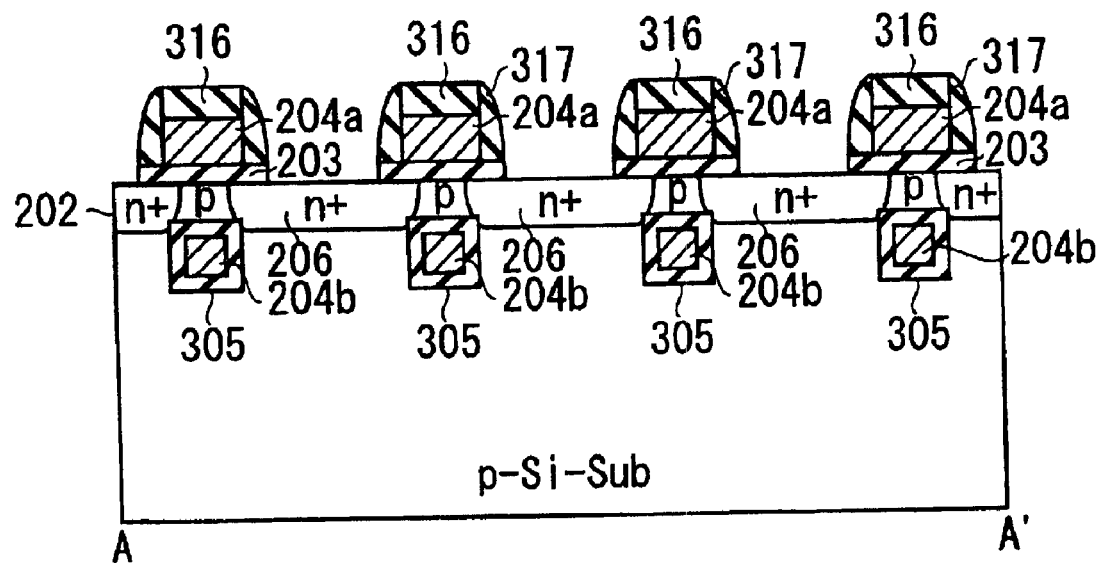
FIG. 38A is a cross-sectional view taken along the A–A' line of FIG. 34 to show a manufacturing process of the same embodiment.
Figure 38B:
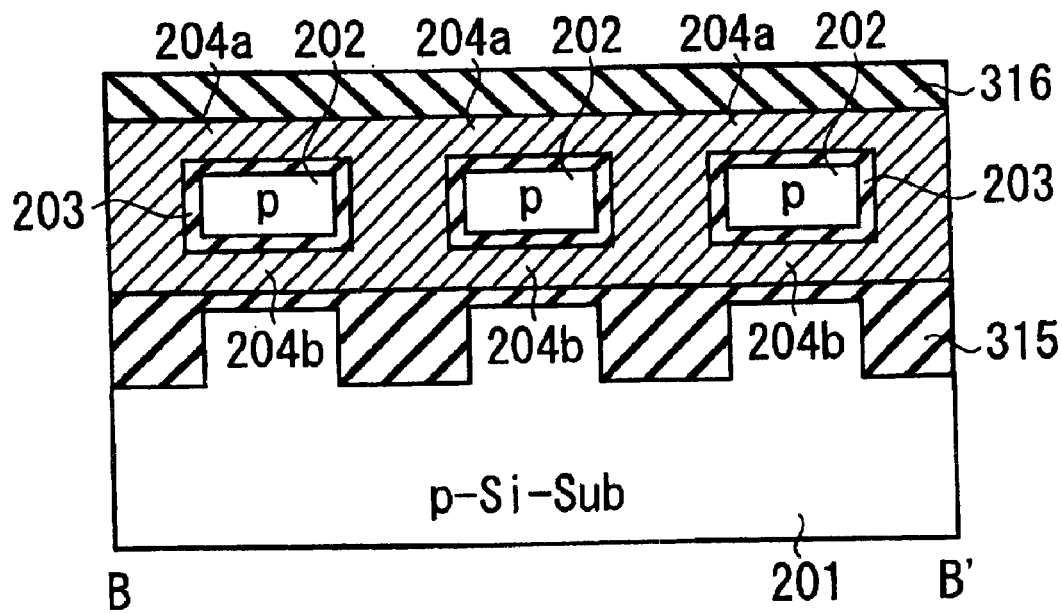
FIG. 38B is a cross-sectional view taken along the A–A' line of FIG. 34 to show a manufacturing process of the same embodiment.

After that, as shown in FIGS. 38A and 38B, a silicon nitride film 317 is formed and processed by etch-back by RIE to remain only on side walls of the gate electrode, and source and drain diffusion layers 206 are formed by doping As ions. The source and drain diffusion regions 206 are formed to be deeper than the top end level of the voids 305. As a result, the bulk region of each transistor can be held floating by electrical isolation by the gate insulating film 203, diffusion layers and device isolating insulation film.

Figure 39A:
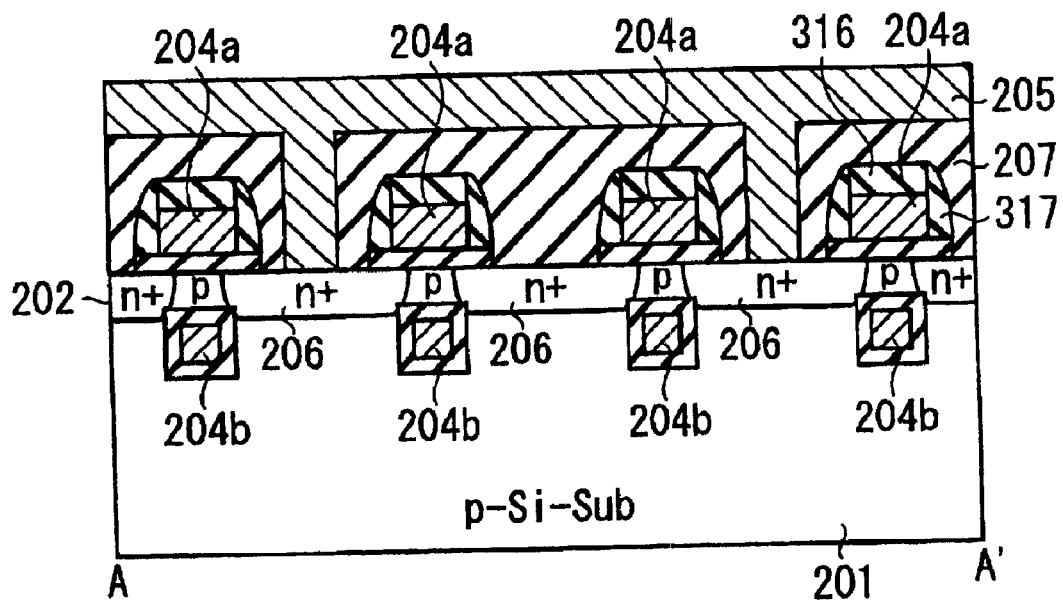
FIG. 39A is a cross-sectional view taken along the A–A' line of FIG. 34 to show a manufacturing process of the same embodiment.
Figure 39B:
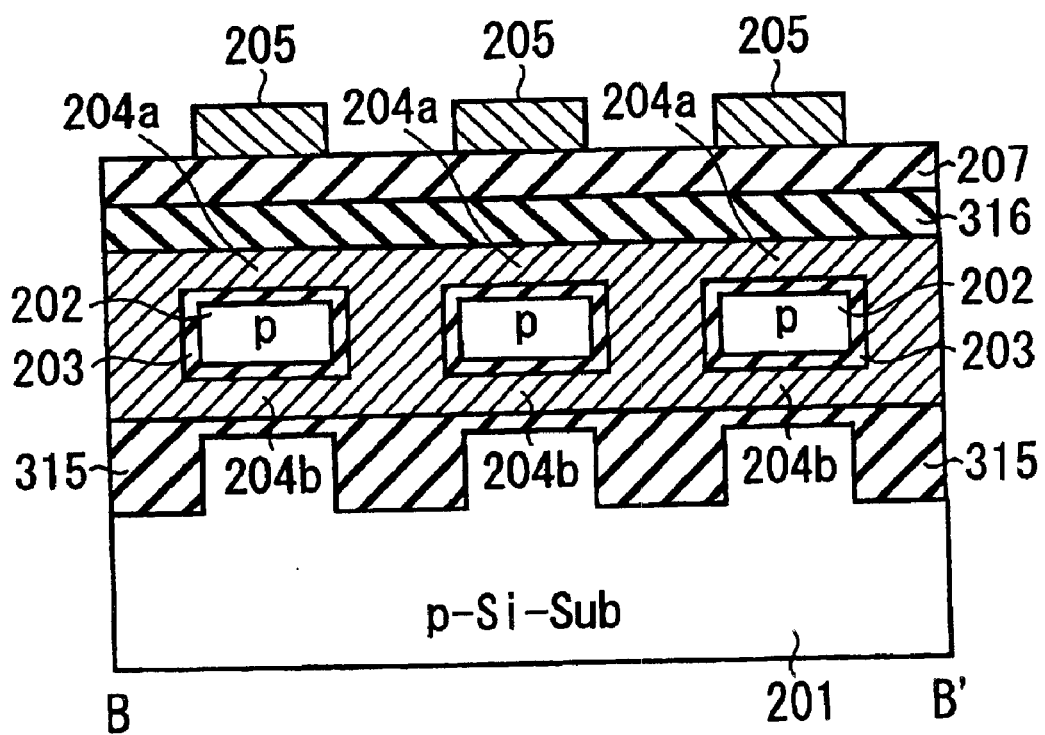
FIG. 39B is a cross-sectional view taken along the A–A' line of FIG. 34 to show a manufacturing process of the same embodiment.

After that, as shown in FIGS. 39A and 39B, the inter-layer insulating film 207 is formed, contact holes are made in the drain diffusion layer regions, and bit lines 205 are formed to extend orthogonally to the word lines. In this case, even if the contacts overlap the word lines due to misalignment between the bit line contacts and the word lines, since there is the silicon nitride film on the top and side surfaces of the word lines, they behave as a protective film of the contacts during the etching process of the silicon oxide film, and the bit lines and the word lines are prevented from short circuit. As a result, the word lines can be arranged in minimum pitches.

The single-transistor memory cell MC according to the instant invention executes dynamic write/read operations according to the same principle as that of the first embodiment. Similarly to the SGT structure, since the gate electrode is formed to encircle the silicon layer and oppose to four surfaces thereof, a large gate capacity can be obtained from a small cell area, and therefore, favorable write and read characteristics are obtained.

The transistor structures according to the second and third embodiments are applicable not only to single-transistor DRAM cells but also to, in general, integrated circuits integrating transistors having a large gate capacity with a small area. In case of the third embodiment, top and bottom portions of the silicon layer are used as channels, it is possible to use only one of them as a channel. For example, a transistor using only the top wall of the void 305 as the channel can be made.

As described above, according to the invention, it is possible to provide a semiconductor memory device capable of dynamic recording of binary data with fewer signal lines by using single-transistor memory cells having a gate large capacity with a small cell area.

What is claimed is:

1. A semiconductor memory device comprising:
   a source diffusion layer of said semiconductor memory device formed on a semiconductor substrate and connected to a fixed potential line, said source diffusion layer being formed as a sheet-form layer covering the surface of the substrate;
   a plurality of columnar semiconductor layers arranged in a matrix form and formed on said source diffusion layer and each having one end connected to said source diffusion layer commonly, said columnar semiconductor layer being arranged to accumulate, to take a first data state with a first threshold voltage, excessive majority carriers in said columnar semiconductor layer, and being arranged to discharge, to take a second data state with a second threshold voltage, excessive majority carriers from said columnar semiconductor layer, said columnar semiconductor layers being electrically insulated from the semiconductor substrate so as to be in an electrical floating state;

a plurality of drain diffusion layers of said semiconductor memory device, each of said plurality of said drain diffusion layers formed at the other end of said columnar semiconductor layer;

a plurality of gate electrodes of said semiconductor memory device, each of said plurality of gate electrodes opposed to said columnar semiconductor layer via a gate insulating film;

a plurality of word lines of said semiconductor memory device, each of said plurality of word lines connected to corresponding said gate electrodes; and a plurality of bit lines of said semiconductor memory device, each of said plurality of bit lines connected to corresponding said drain diffusion layers, said bit lines being perpendicular to said word lines.

2. The semiconductor memory device according to claim 1 wherein said source diffusion layer is made as a planar shape and commonly connects said columnar semiconductor layers arranged along said bit lines and said word lines.

3. The semiconductor memory device according to claim 1 wherein said source diffusion layer is formed to commonly connect said columnar semiconductor layers aligned along each said bit line.

4. The semiconductor memory device according to claim 1 wherein said source diffusion layer is formed to commonly connect said columnar semiconductor layers aligned along each said word line.

5. The semiconductor memory device according to claim 1 wherein each said columnar semiconductor layer is formed by processing said semiconductor substrate, and said source diffusion layer is formed at the bottom portions of said columnar semiconductor layers to keep said columnar semiconductor layers floating state where said columnar semiconductor layers are electrically isolated from said semiconductor substrate.

6. The semiconductor memory device according to claim 1 wherein said first data state is set by holding in said columnar semiconductor layer supplied with a predetermined potential from said gate electrode an excessive amount of majority carriers generated by impact ionization caused by flowing a channel current from said drain diffusion layer to said columnar semiconductor layer, and said second data state is set by discharging excessive majority carriers in said columnar semiconductor layer supplied with predetermined potential from said gate electrode to said drain diffusion layer by applying forward bias between said drain diffusion layer and said columnar semiconductor layer.

7. The semiconductor memory device according to claim 1 wherein said semiconductor substrate is a p-type silicon substrate.

8. The semiconductor memory device according to claim 1 wherein, upon a data write operation, said fixed potential line is set at a reference potential and wherein a first potential higher than said reference potential is applied to a selected word line, a second potential lower than said reference potential is applied to non-selected word lines, and a third potential higher than said reference potential and a fourth potential lower than said reference potential are applied to said bit lines depending upon said first and second data states, respectively.

9. The semiconductor memory device according to claim 8 wherein, upon a data read operation, a fifth potential between said first threshold voltage and said second threshold voltage and higher than said reference potential is applied to a second word line, to detect whether a selected memory cell is in a conduction state or in a non-conduction state.

10. The semiconductor memory device according to claim 8 wherein, upon a data read operation, a fifth potential higher than said first and second threshold voltages and higher than said reference potential is applied to a selected word line, to detect conductivity of a selected memory cell.

* * * * *

UNITED STATES PATENT AND TRADEMARK OFFICE
CERTIFICATE OF CORRECTION

PATENT NO. : 6,891,225 B2
DATED : May 10, 2005
INVENTOR(S) : Fumio Horiguchi et al.

It is certified that error appears in the above-identified patent and that said Letters Patent is hereby corrected as shown below:

Title page,
Item [56], References Cited, OTHER PUBLICATIONS, insert:
-- Chinese Office Action issued on October 10, 2003, and its English translation. --.

Column 14,
Lines 7-8, replace "with predetermined" with -- with a predetermined --.

Signed and Sealed this

Twenty-fourth Day of January, 2006

JON W. DUDAS
*Director of the United States Patent and Trademark Office*